United States Patent
Lin et al.

(10) Patent No.: US 12,261,225 B2
(45) Date of Patent: Mar. 25, 2025

(54) OXIDE THIN FILM TRANSISTOR, METHOD FOR PREPARING SAME, AND DISPLAY APPARATUS

(71) Applicants: Fuzhou BOE Optoelectronics Technology Co., LTD., Fujian (CN); BOE Technology Group Co., Ltd., Beijing (CN)

(72) Inventors: Bin Lin, Beijing (CN); Zengrong Li, Beijing (CN); Hangle Guo, Beijing (CN); Zhenyou Zou, Beijing (CN); Liangliang Li, Beijing (CN); Fadian Le, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/772,669

(22) PCT Filed: Dec. 1, 2020

(86) PCT No.: PCT/CN2020/133087
§ 371 (c)(1),
(2) Date: Apr. 28, 2022

(87) PCT Pub. No.: WO2022/115992
PCT Pub. Date: Jun. 9, 2022

(65) Prior Publication Data
US 2024/0170579 A1    May 23, 2024

(51) Int. Cl.
*H01L 29/786* (2006.01)
*H01L 29/417* (2006.01)
*H01L 29/66* (2006.01)

(52) U.S. Cl.
CPC .. *H01L 29/78693* (2013.01); *H01L 29/41733* (2013.01); *H01L 29/6675* (2013.01); *H01L 29/78696* (2013.01)

(58) Field of Classification Search
CPC ............. H01L 27/1225; H01L 29/7869; H01L 29/78696; H01L 29/41733; C23C 14/34
See application file for complete search history.

(56) References Cited

U.S. PATENT DOCUMENTS

| | | |
|---|---|---|
| 8,841,665 B2 | 9/2014 | Park et al. |
| 2010/0025676 A1 | 2/2010 | Yamazaki et al. |

(Continued)

FOREIGN PATENT DOCUMENTS

| | | |
|---|---|---|
| CN | 101640220 A | 2/2010 |
| CN | 102160104 A | 8/2011 |

(Continued)

OTHER PUBLICATIONS

Extended European search report of counterpart European application No. 20963841.0 issued on Sep. 11, 2023.

*Primary Examiner* — Alia Sabur
(74) *Attorney, Agent, or Firm* — Lippes Mathias LLP

(57) ABSTRACT

Provided is an oxide thin film transistor, including a gate, a gate insulator, a channel layer, a protective layer, and a source electrode and drain electrode layer that are disposed on a base substrate, wherein the source electrode and drain electrode layer includes a source electrode and a drain electrode that are spaced; and the protective layer is disposed between the channel layer and the source electrode and drain electrode layer, and is in contact with both the source electrode and drain electrode layer and the channel layer; an orthographic projection of the protective layer on the base substrate covers an orthographic projection of the channel layer on the base substrate; and the protective layer (Continued)

includes a first portion, a second portion, and a third portion that are in different areas of the protective layer.

15 Claims, 18 Drawing Sheets

(56) References Cited

U.S. PATENT DOCUMENTS

| | | | |
|---|---|---|---|
| 2010/0072467 A1 | 3/2010 | Yamazaki et al. | |
| 2013/0015453 A1 | 1/2013 | Sato | |
| 2013/0278855 A1 | 10/2013 | Uemura et al. | |
| 2013/0334533 A1* | 12/2013 | Yamazaki | H01L 29/786 |
| | | | 257/66 |
| 2014/0061633 A1 | 3/2014 | Wang et al. | |
| 2014/0103333 A1 | 4/2014 | Liu et al. | |
| 2014/0103346 A1 | 4/2014 | Yamazaki | |
| 2014/0306219 A1* | 10/2014 | Yamazaki | H01L 27/1225 |
| | | | 257/43 |
| 2016/0141397 A1* | 5/2016 | Yamazaki | H01L 27/1225 |
| | | | 438/104 |
| 2016/0141422 A1 | 5/2016 | Matsubayashi et al. | |
| 2016/0343834 A1 | 11/2016 | Xu | |
| 2017/0104089 A1* | 4/2017 | Koezuka | H01L 29/78696 |
| 2017/0338108 A1 | 11/2017 | Yamazaki et al. | |
| 2018/0190825 A1* | 7/2018 | Yamazaki | H01L 29/78606 |
| 2020/0411694 A1* | 12/2020 | Koezuka | H01L 29/78618 |

FOREIGN PATENT DOCUMENTS

| | | |
|---|---|---|
| CN | 102646699 A | 8/2012 |
| CN | 102751240 A | 10/2012 |
| CN | 103003947 A | 3/2013 |
| CN | 104392928 A | 3/2015 |
| CN | 108461391 A | 8/2018 |
| CN | 109075209 A | 12/2018 |
| CN | 111615743 A | 9/2020 |

* cited by examiner

OXIDE THIN FILM TRANSISTOR, METHOD FOR PREPARING SAME, AND DISPLAY APPARATUS

CROSS-REFERENCE TO RELATED APPLICATION

This application is a 371 of PCT application No. PCT/CN2020/133087, filed on Dec. 1, 2020, the disclosure of which is herein incorporated herein by reference in its entirety.

TECHNICAL FIELD

The present disclosure relates to the field of display technologies, and in particular, to an oxide thin film transistor, a method for preparing the same, and a display apparatus.

BACKGROUND

Indium gallium zinc oxide (IGZO) has been widely used in preparation of an active layer of a thin film transistor due to its high mobility, homogeneity and transparency.

SUMMARY

The present disclosure provides an oxide thin film transistor, a method for preparing the same, and a display apparatus. The technical solutions are as follows. An oxide thin film transistor includes:
- a gate, a gate insulator, a channel layer, a protective layer, and a source electrode and drain electrode layer that are disposed on a base substrate, wherein the source electrode and drain electrode layer includes a source electrode and a drain electrode that are spaced;
- the protective layer is disposed between the channel layer and the source electrode and drain electrode layer, and is in contact with both the source electrode and drain electrode layer and the channel layer; an orthographic projection of the protective layer on the base substrate covers an orthographic projection of the channel layer on the base substrate; and the protective layer includes a first portion, a second portion, and a third portion that are in different areas of the protective layer;
- the first portion has two surfaces, and the two surfaces of the first portion are in contact with the channel layer and the source electrode respectively; the second portion has two surfaces, and the two surfaces of the second portion are in contact with the channel layer and the drain electrode respectively; the third portion has two surfaces, one of the two surfaces of the third portion is in contact with the channel layer, and the other surface of the third portion is in contact with neither the source electrode nor the drain electrode;
- wherein an electrical conductivity of a first target portion of the first portion proximal to the source electrode and an electrical conductivity of a second target portion of the second portion proximal to the drain electrode are both greater than an electrical conductivity of the third portion, and a thickness of the first target portion is less than a thickness of the first portion, and a thickness of the second target portion is less than a thickness of the second portion.

In some implementations, both materials of the channel layer and the protective layer are multi-element metallic oxides; wherein the multi-element metallic oxide of the channel layer is a nano-crystalline oxide or amorphous oxide; and
the multi-element metallic oxide of a side of the protective layer proximal to the channel layer is a c-axis crystalline oxide.

In some implementations,
both materials of the channel layer and the protective layer are indium gallium zinc oxides (IGZOs); wherein
the IGZO of the channel layer is a nano-crystalline oxide or amorphous oxide; and
the IGZO of a side of the protective layer proximal to the channel layer is a c-axis crystalline oxide.

In some implementations,
the protective layer includes a first film layer and a second film layer that are laminated; the first film layer is in contact with the channel layer; and the second film layer includes a first sub-film layer in contact with the source electrode and a second sub-film layer in contact with the drain electrode;
wherein the first sub-film layer is the first target portion of the first portion proximal to the source electrode;
and the second sub-film layer is the second target portion of the second portion proximal to the drain electrode; and
the first film layer includes the third portion, a third target portion of the first portion which is comprised of remaining of the first portion other than the first target portion and a fourth target portion of the second portion which is comprised of remaining of the second portion other than the second target portion, wherein the third target portion is farther from the source electrode than the first target portion is, and the fourth target portion is farther from the drain electrode than the second target portion is; and an electrical conductivity of the first film layer is lower than an electrical conductivity of the second film layer.

In some implementations,
the channel layer and the second film layer are nano-crystalline IGZO film layers; and
the first film layer is a c-axis crystalline IGZO film layer.

In some implementations,
a ratio of indium atoms to gallium atoms to zinc atoms of the nano-crystalline IGZO film layer is 4:2:3.

In some implementations,
a thickness of the channel layer ranges from 1 nm to 30 nm;
a thickness of the first film layer ranges from 1 nm to 30 nm; and
a thickness of the second film layer ranges from 1 nm to 100 nm.

In some implementations,
both the first film layer and the second film layer are c-axis crystalline IGZO film layers; a quantity of oxygen vacancies of the second film layer is greater than a quantity of oxygen vacancies of the first film layer; and the second film layer is a film layer acquired by performing plasma processing on the c-axis crystalline IGZO film layer, a temperature of the plasma processing ranging from 200° C. to 300° C.

In some implementations,
a surface of the first sub-film distal from the first film layer and a surface of the second sub-film layer distal from the first film layer are both of uneven structures acquired through plasma processing.

In some implementations,
a thickness of the channel layer ranges from 1 nm to 30 nm; and
a thickness of the protective layer ranges from 20 nm to 50 nm.

In some implementations,
a grain size of the nano-crystalline oxide ranges from 2 nm to 4 nm.

In some implementations,
a thickness of the third portion is less than a thickness of the first portion; and the thickness of the third portion is less than a thickness of the second portion.

An oxide thin film transistor includes:
a gate, a gate insulator, a channel layer, a protective layer, and a source electrode and drain electrode layer that are disposed on a base substrate, wherein the source electrode and drain electrode layer includes a source electrode and a drain electrode that are spaced; and
an orthographic projection of the protective layer on the base substrate covers an orthographic projection of the channel layer on the base substrate; and the protective layer includes a first portion, a second portion, and a third portion; wherein
an orthographic projection of the first portion on the base substrate covers a first area, and the first area is an overlapped area of an orthographic projection of the source electrode on the base substrate and the orthographic projection of the channel layer on the base substrate; an orthographic projection of the second portion on the base substrate covers a second area, and the second area is an overlapped area of an orthographic projection of the drain electrode on the base substrate and the orthographic projection of the channel layer on the base substrate; an orthographic projection of the third portion on the base substrate covers a third area, and the third area is an overlapped area of an orthographic projection of a spacing area on the base substrate and the orthographic projection of the channel layer on the base substrate, the spacing area being an area between the source electrode and the drain electrode,
wherein an electrical conductivity of a first target portion of the first portion proximal to the source electrode and an electrical conductivity of a second target portion of the second portion proximal to the drain electrode are both greater than an electrical conductivity of the third portion, and a thickness of the first target portion is less than a thickness of the first portion, and a thickness of the second target portion is less than a thickness of the second portion.

In some implementations,
the protective layer includes a first film layer and a second film layer that are laminated sequentially along a direction going away from the base substrate; wherein
an orthographic projection of the first film layer on the base substrate covers the orthographic projection of the channel layer on the base substrate;
the second film layer includes a first sub-film layer and a second sub-film layer that are spaced, wherein an orthographic projection of the first sub-film layer on the base substrate covers the first area, and an orthographic projection of the second sub-film layer on the base substrate covers the second area; and
an electrical conductivity of the channel layer and an electrical conductivity of the second film layer are both greater than an electrical conductivity of the first film layer.

In some implementations,
all materials of the channel layer, the first film layer, and the second film layer are multi-element metallic oxides; wherein
the multi-element metallic oxides of the channel layer and the second film layer are nano-crystalline oxides or amorphous oxides; and
the multi-element metallic oxide of the first film layer is a c-axis crystalline oxide;
wherein all materials of the channel layer, the first film layer, and the second film layer are IGZOs;
the IGZOs of the channel layer and the second film layer are nano-crystalline oxides or amorphous oxides; and
an IGZO of the first film layer is the c-axis crystalline oxide; or
wherein the channel layer and the second film layer are nano-crystalline IGZO film layers; and
the first film layer is a c-axis crystalline IGZO film layer.

In some implementations,
both the first film layer and the second film layer are c-axis crystalline IGZO film layers; a quantity of oxygen vacancies of the second film layer is greater than a quantity of oxygen vacancies of the first film layer; and the second film layer is a film layer acquired by performing plasma processing on the c-axis crystalline IGZO film layer, a temperature of the plasma processing ranging from 200° C. to 300° C.

A method for preparing an oxide thin film transistor includes:
forming a gate, a gate insulator, a channel layer, a protective layer, and a source electrode and drain electrode layer on a base substrate, wherein the source electrode and drain electrode layer includes a source electrode and a drain electrode that are spaced;
the protective layer is disposed between the channel layer and the source electrode and drain electrode layer, and is in contact with both the source electrode and drain electrode layer and the channel layer; an orthographic projection of the protective layer on the base substrate covers an orthographic projection of the channel layer on the base substrate; and the protective layer includes a first portion, a second portion, and a third portion that are in different areas of the protective layer,
wherein the first portion has two surfaces, and the two surfaces of the first portion are in contact with the channel layer and the source electrode respectively; the second portion has two surfaces, and the two surfaces of the second portion are in contact with the channel layer and the drain electrode respectively; the third portion has two surfaces, one of the two surfaces of the third portion is in contact with the channel layer, and the other surface of the third portion is in contact with neither the source electrode nor the drain electrode,
wherein an electrical conductivity of a first target portion of the first portion proximal to the source electrode and an electrical conductivity of a second target portion of the second portion proximal to the drain electrode are both greater than an electrical conductivity of the third portion, a thickness of the first target portion is less than a thickness of the first portion, and a thickness of the second target portion is less than a thickness of the second portion.

In some implementations,
a first protective film layer is formed on the base substrate by using a magnetron sputtering device, wherein when the first protective film layer is formed, the oxygen content of sputtering gases from the magnetron sputtering device ranges from 80% to 100%, and a temperature of the base substrate ranges from 100° C. to 300° C.; and a second protective film layer is formed on the base substrate by using the magnetron sputtering device, wherein when the second protective film layer is formed, the oxygen content of the sputtering gases from the magnetron sputtering device ranges from 1% to 30%, and the temperature of the base substrate ranges from 100° C. to 200° C.;

wherein a material of the first protective film layer includes a c-axis crystalline IGZO, and a material of the second protective film layer includes a nano-crystalline IGZO.

In some implementations, forming the protective layer on the base substrate includes:

forming a third protective film layer on the base substrate;

patterning the third protective film layer to acquire a second protective pattern, wherein an orthographic projection of the second protective pattern on the base substrate covers the orthographic projection of the channel layer on the base substrate;

performing plasma processing on a side of the second protective pattern distal from the base substrate by using a plasma processing device; and etching a surface of an area, overlapped with neither the source electrode nor the drain electrode, of the second protective pattern on which the plasma processing is performed to acquire the protective layer, and an etching depth of the second protective pattern is less than a thickness of the second protective pattern.

A display apparatus includes a base substrate and a plurality of the foregoing oxide thin film transistors disposed on the base substrate.

BRIEF DESCRIPTION OF THE DRAWINGS

To describe the technical solutions in the embodiments of the present disclosure more clearly, the following briefly describes the accompanying drawings required in the embodiments. Apparently, the accompanying drawings in the following descriptions show merely some embodiments of the present disclosure, and persons of ordinary skill in the art may still derive other drawings from these accompanying drawings without creative efforts.

DETAILED DESCRIPTION

To make the objectives, technical solutions, and advantages of the present disclosure clearer, the following further describes implementations of the present disclosure in detail with reference to the accompanying drawings.

In the related art, a thin film transistor includes a gate, an insulating layer, an active layer, and a source electrode and drain electrode layer that are sequentially laminated along a direction going away from a base substrate. When the source electrode and drain electrode layer is formed, a preformed source electrode and drain electrode film layer needs to be etched with etchant. The source electrode and drain electrode layer includes a source electrode and a drain electrode that are spaced, and the source electrode and the drain electrode may be conducted via the active layer. To prevent the etchant used to etch the source electrode and drain electrode film layer from affecting the active layer, the thin film transistor may further include a protective layer disposed between the active layer and the source electrode and drain electrode layer. An orthographic projection of the protective layer on the base substrate covers an orthographic projection of the active layer on the base substrate, and the protective layer may be configured to prevent the etchant from etching the active layer. In addition, because the protective layer is disposed between the active layer and the source electrode and drain electrode layer, the current needs to first flow into the protective layer from the source electrode or the drain electrode, and then flow into the active layer from the protective layer, thereby conducting the source electrode and the drain electrode. Here, the active layer is prepared from a nano-crystalline IGZO, and the protective layer is prepared from a crystalline oxide.

However, because the electrical conductivity of the crystalline oxide used to prepare the protective layer is relatively low, when the current flows into the protective layer from the source electrode or the drain electrode, a large amount of heat is generated in the protective layer, which affects the active layer. As a result, the electrical conductivity of the thin film transistor is relatively low.

Figure 1:
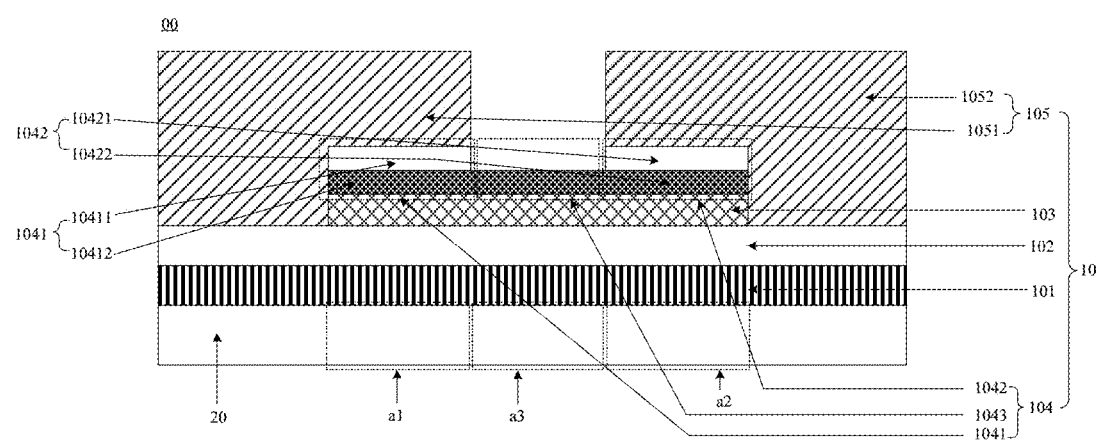
FIG. 1 is a schematic structural diagram of a display apparatus according to an embodiment of the present disclosure.

FIG. 1 is a schematic structural diagram of a display apparatus according to an embodiment of the present disclosure. Referring to FIG. 1, it can be learned that, the oxide thin film transistor 10 may include a gate 101, a gate insulator 102, a channel layer 103, a protective layer 104, and a source electrode and drain electrode layer 105 that are disposed on a base substrate 20. The source electrode and drain electrode layer 105 may include a source electrode 1051 and a drain electrode 1052 that are spaced.

In an optional implementation, referring to FIG. 1, the protective layer 104 may be disposed between the channel layer 103 and the source electrode and drain electrode layer 105. The protective layer 104 may be in contact with both the source electrode and drain electrode layer 105 and the channel layer 103. An orthographic projection of the protective layer 104 on the base substrate 20 may cover an orthographic projection of the channel layer 103 on the base substrate 20. The protective layer 104 may be configured to protect the channel layer 103, to prevent an etchant from etching the side of the channel layer 103 distal from the base substrate 20, thereby ensuring the reliability of current transmission through the channel layer 103.

Referring to FIG. 1, it can be further learned that, the protective layer 104 may include a first portion 1041, a second portion 1042, and a third portion 1043 in different areas of the protective layer 104. The first portion 1041 may have two surfaces, and the two surfaces of the first portion 1041 may be in contact with the channel layer 103 and the source electrode 1051 respectively. The second portion 1042 may have two surfaces, and the two surfaces of the second portion 1042 may be in contact with the channel layer 103 and the drain electrode 1052 respectively. The third portion 1043 may have two surfaces, one of the two surfaces of the third portion 1043 may be in contact with the channel layer 103, and the other surface may be in contact with neither the source electrode 1051 nor the drain electrode 1052.

Referring to FIG. 1, it can be learned that, the third portion 1043 may be disposed between the first portion 1041 and the second portion 1042. The electrical conductivity of a first target portion 10411 of the first portion 1041 proximal to the source electrode 1051 and the electrical conductivity of a second target portion 10421 of the second portion 1042 proximal to the drain electrode 1052 may be both greater than the electrical conductivity of the third portion 1043. That is, the first target portion 10411 of the first portion 1041 proximal to the source electrode 1051 and the second target portion 10421 of the second portion 1042 proximal to the drain electrode 1052 may have relatively good electrical conductivity, and the third portion 1043 may have a relatively low electrical conductivity.

Because the electrical conductivity of the third portion 1043 is relatively low, the current of the source electrode 1051, after flowing from the first portion 1041, cannot be transmitted to the second portion 1042 through the third portion 1043; and the current of the drain electrode 1052, after flowing from the second portion 1042, is not transmitted to the first portion 1041 through the third portion 1043. Because the electrical conductivity of the channel layer 103 disposed on the side of the protective layer 104 proximal to the base substrate 20 is relatively good, the current of the source electrode 1051, after flowing from the first portion 1041, may be transmitted to the drain electrode 1052 through the channel layer 103 and the second portion 1042 of the protective layer 104 sequentially; and the current of the drain electrode 1052, after flowing from the second portion 1042, may be transmitted to the source electrode 1051 through the channel layer 103 and the first portion 1041 of the protective layer 104 sequentially.

In the embodiments of the present disclosure, because both the first target portion 10411 of the first portion 1041 proximal to source electrode 1051 and the second target portion 10421 of the second portion 1042 proximal to the drain electrode 1052 have relatively good electrical conductivity, when the current flows into the protective layer 104 from the source electrode 1051 or the drain electrode 1052, a large amount of heat is not generated in the protective layer 104. Therefore, the reliability of the oxide thin film transistor 10 is improved.

In another optional implementation, referring to FIG. 1, the oxide thin film transistor 10 may include a gate 101, a gate insulator 102, a channel layer 103, a protective layer 104, and a source electrode and drain electrode layer 105 that are disposed on a base substrate 20. The source electrode and drain electrode layer 105 may include a source electrode 1051 and a drain electrode 1052 that are spaced.

The orthographic projection of the protective layer 104 on the base substrate 20 may cover the orthographic projection of the channel layer 103 on the base substrate 20. The protective layer 104 may be configured to protect the channel layer 103, to prevent an etchant from etching the side of the channel layer 103 distal from the base substrate 20, thereby ensuring the reliability of current transmission through the channel layer 103.

Referring to FIG. 1, it can be further learned that, the protective layer 104 may include a first portion 1041, a second portion 1042, and a third portion 1043. The orthographic projection of the first portion 1041 on the base substrate 20 covers a first area a1; the orthographic projection of the second portion 1042 on the base substrate 20 covers a second area a2; and the orthographic projection of the third portion 1043 on the base substrate 20 covers a third area a3.

The first area a1 is an overlapped area of the orthographic projection of the source electrode 1051 on the base substrate 20 and the orthographic projection of the channel layer 103 on the base substrate 20. The second area a2 is an overlapped area of the orthographic projection of the drain electrode 1052 on the base substrate 20 and the orthographic projection of the channel layer 103 on the base substrate 20. The third area a3 is an overlapped area of the orthographic projection of a spacing area on the base substrate 20 and the orthographic projection of the channel layer 103 on the base substrate 20. The spacing area is located between the source electrode 1051 and the drain electrode 1052.

Referring to FIG. 1, it can be learned that, the third portion 1043 may be disposed between the first portion 1041 and the second portion 1042. The electrical conductivity of the first target portion 10411 of the first portion 1041 proximal to source electrode 1051 and the electrical conductivity of the second target portion 10421 of the second portion 1042 proximal to the drain electrode 1052 are both greater than the electrical conductivity of the third portion 1043. The electrical conductivity of the first target portion 10411 of the first portion 1041 proximal to source electrode 1051 and the electrical conductivity of the second target portion 10421 of the second portion 1042 proximal to the drain electrode 1052 may be relatively good; and the electrical conductivity of the third portion 1043 may be relatively low.

Because the electrical conductivity of the third portion 1043 is relatively low, the current of the source electrode 1051, after flowing from the first portion 1041, cannot be transmitted to the second portion 1042 through the third portion 1043; and the current of the drain electrode 1052, after flowing from the second portion 1042, cannot be transmitted to the first portion 1041 through the third portion 1043. Because the electrical conductivity of the channel layer 103 disposed on the side of the protective layer 104 proximal to the base substrate 20 is relatively good, the current of the source electrode 1051, after flowing from the first portion 1041, may be transmitted to the drain electrode 1052 through the channel layer 103 and the second portion 1042 of the protective layer 104 sequentially; and the current of the drain electrode 1052, after flowing from the second portion 1042, may be transmitted to the source electrode 1051 through the channel layer 103 and the first portion 1041 of the protective layer 104 sequentially.

In the embodiments of the present disclosure, because both the electrical conductivity of the first target portion 10411 of the first portion 1041 proximal to source electrode 1051 and the electrical conductivity of the second target portion 10421 of the second portion 1042 proximal to the drain electrode 1052 are relatively good, when the current flows into the protective layer 104 from the source electrode 1051 or the drain electrode 1052, a large amount of heat is not generated in the protective layer 104. Therefore, the reliability of the oxide thin film transistor 10 is improved.

In the foregoing two implementations of the embodiments of the present disclosure, materials of both the channel layer 103 and the protective layer 104 may be multi-element metallic oxides. The multi-element metallic oxide of the channel layer 103 may be a nano-crystalline oxide or amorphous oxide. The multi-element metallic oxide of the side of the protective layer 104 proximal to the channel layer 103 may be a c-axis crystalline oxide.

Alternatively, the materials of both the channel layer 103 and the protective layer 104 may be IGZOs. The IGZO of the channel layer 103 may be a nano-crystalline oxide or amorphous oxide. The IGZO of the side of the protective layer 104 proximal to the channel layer 103 may be a c-axis crystalline oxide.

Here, the grain size of the nano-crystalline oxide is greater than 1 nm, and may range from 2 nm to 4 nm. For example, the grain size may be 3 nm.

Figure 2:
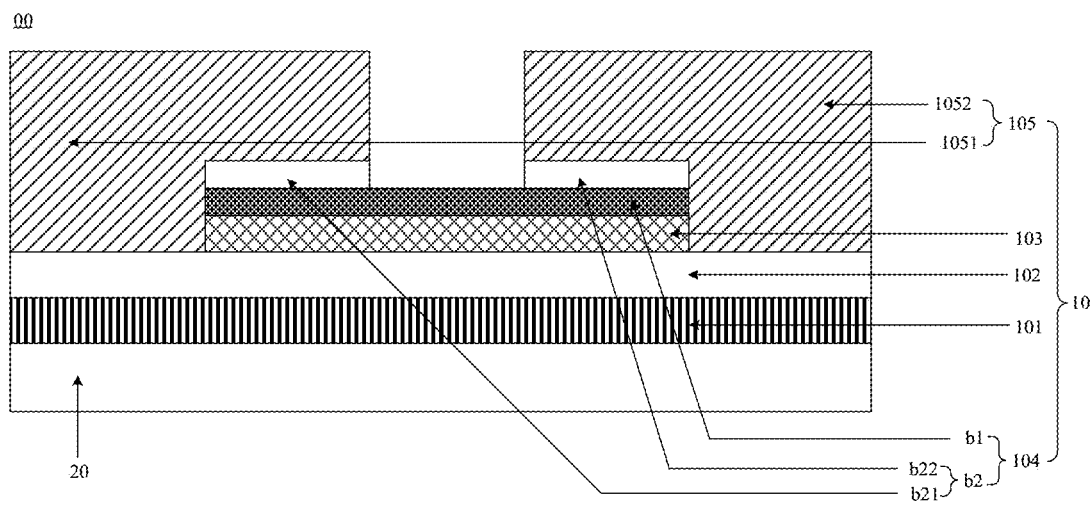
FIG. 2 is a schematic structural diagram of another display apparatus according to an embodiment of the present disclosure.

In an optional implementation, referring to FIG. 2, the protective layer 104 may include a first film layer b1 and a second film layer b2 that are laminated. The two film layers of the protective layer 104 may be prepared through two patterning processes, instead of one patterning process.

Referring to FIG. 2, the first film layer b1 may be in contact with the channel layer 103. With reference to FIGS. 1 and 2, the first film layer b1 may include the third portion 1043 disposed between the source electrode 1051 and the drain electrode 1052, a part, distal from the source electrode 1051, of the first portion 1041 under the source electrode 1051, and a part, distal from the drain electrode 1052, of the second portion 1042 under the drain electrode 1052. Referring to FIG. 2, the second film layer b2 may include a first sub-film layer b21 in contact with the source electrode 1051 and a second sub-film layer b22 in contact with the drain electrode 1052. In combination with FIGS. 1 and 2, the first sub-film layer b21 may be the first target portion 10411 of the first portion 1041 proximal to source electrode 1051, and the first target portion 10411 is in contact with the source electrode 1051 and performs an electricity conduction function. The second sub-film layer b22 may be the second target portion 10421 of the second portion 1042 proximal to the drain electrode 1052, and the second target portion 10421 is in contact with the drain electrode 1052 and performs an electricity conduction function. The first film layer b1 and the second film layer b2 are differentiated by material, not merely by location. The electrical conductivity of the first film layer b1 is lower than the electrical conductivity of the second film layer b2.

The electrical conductivity of the first film layer b1 may be lower than the electrical conductivity of the second film layer b2. In an implementation, the quantity of oxygen vacancies of the first sub-film layer b21 of the second film layer b2 and the quantity of oxygen vacancies of the second sub-film layer b22 of the second film layer b2 may be both greater than the quantity of oxygen vacancies of the first film layer b1. In this case, the larger quantity the oxygen vacancies, the larger quantity the free electrons and the greater the electrical conductivity.

Referring to FIG. 2, it can be learned that, the first film layer b1 of the protective layer may have two surfaces. One of the two surfaces of the first film layer b1 may be in contact with the channel layer 103. The other surface may include: a first surface area in contact with the first sub-film layer b21, a second surface area in contact with the second sub-film layer b22, and a third surface area that is located between the first surface area and the second surface area and in contact with neither the first sub-film layer b21 nor the second sub-film layer b22.

In the embodiments of the present disclosure, the first sub-film layer b21 of the second film layer b2 and a third target portion 10412, overlapped with the first sub-film layer b21, of the first film layer b1 may form the first portion 1041 of the protective layer 104. The second sub-film layer b22 of the second film layer b2 and a fourth target portion 10422, overlapped with the second sub-film layer b22, of the first film layer b1 may form the second portion 1042 of the protective layer 104. The part, in contact with neither the first sub-film layer b21 nor the second sub-film layer b22, of the first film layer b1 forms the third portion 1043 of the protective layer 104.

In the embodiments of the present disclosure, the electrical conductivity of the channel layer 103 and the electrical conductivity of the second film layer b2 may be both greater than that of the first film layer b1. Because the second film layer b2 is proximal to the source electrode and drain electrode layer 105 relative to the first film layer b1, the current of the source electrode and drain electrode layer 105 may flow into the channel layer 103 through the second film layer b2 and the first film layer b1 sequentially. In addition, because the second film layer b2 has a relatively good electrical conductivity, when the current flows into the second film layer b2, a large amount of heat is not generated in the second film layer b2, and the second film layer b2 can perform a heat buffering function. Therefore, defects caused by the impact of a large amount of heat can be prevented from generating in the channel layer 103, and the electrical conductivity of the oxide thin film transistor 10 is ensured.

Optionally, the first film layer b1 is a c-axis crystalline oxide film layer, and the second film layer b2 is a nano-crystalline oxide film layer. The nano-crystalline IGZO film layer is dense (a density of the nano-crystalline IGZO film layer is greater than 6.4 g/cm$^3$; and a density of a conventional amorphous IGZO film layer is less than 5.7 g/cm$^3$). A top-layer nano-crystalline IGZO matches a middle-layer c-axis crystalline IGZO. Due to the certain crystallization property of the nano-crystalline IGZO, the transition from the top-layer nano-crystalline IGZO to the middle-layer c-axis crystalline IGZO is good in terms of film layers. And the top-layer nano-crystalline IGZO well matches the middle-layer c-axis crystalline IGZO in terms of grain structures, which can avoid generation of unnecessary contact resistance.

Optionally, the channel layer 103 and the second film layer b2 may be nano-crystalline IGZO film layers. That is, the materials of the channel layer 103 and the second film layer b2 may be nano-crystalline IGZOs. The first film layer b1 may be the c-axis crystalline IGZO film layer. That is, the material of the first film layer b1 may be a c-axis crystalline IGZO (CAAC-IGZO).

Here, the ratio of indium atoms to gallium atoms to zinc atoms of the nano-crystalline IGZO film layer may be 4:2:3. That is, the ratio of indium atoms to gallium atoms to zinc atoms in the nano-crystalline IGZO may be 4:2:3. Certainly, the ratio of indium atoms to gallium atoms to zinc atoms of the c-axis crystalline IGZO film layer may also be 4:2:3. That is, the ratio of indium atoms to gallium atoms to zinc atoms in the c-axis crystalline IGZO may be 4:2:3.

Therefore, the ratio among atoms of elements in the material of the channel layer 103, the ratio among atoms of elements in the first film layer b1, and the ratio among atoms of elements in the second film layer b2 are the same. Therefore, the target material does not need to be changed when the channel layer 103, the first film layer b1, and the second film layer b2 are prepared through magnetron sputtering.

In addition, because the materials of the channel layer 103 and the second film layer b2 may be the same, the channel layer 103 and the second film layer b2 may be prepared by the same technology.

In the embodiments of the present disclosure, the materials of the first portion 1041 of the protective layer 104 may include a nano-crystalline IGZO and a c-axis crystalline IGZO; the materials of the second portion 1042 of the protective layer 104 may include a nano-crystalline IGZO and a c-axis crystalline IGZO; and the materials of the third portion 1043 of the protective layer 104 may include a c-axis crystalline IGZO.

Optionally, the thickness of the channel layer 103 may range from 1 nm to 30 nm; the thickness of the first film layer b1 may range from 1 nm to 30 nm; and the thickness of the second film layer b2 may range from 1 nm to 100 nm.

In the embodiments of the present disclosure, compared with the third portion 1043, the first portion 1041 and the second portion 1042 each have one more second film layer b2. Both the thickness of the first portion 1041 and the thickness of the second portion 1042 may be equal to the total thickness of the first film layer b1 and the second film layer b2. The thickness of the third portion 1043 is equal to the thickness of the first film layer b1. That is, the thickness of the third portion 1043 may be less than the thickness of the first portion 1041 or the thickness of the second portion 1042.

Figure 3:
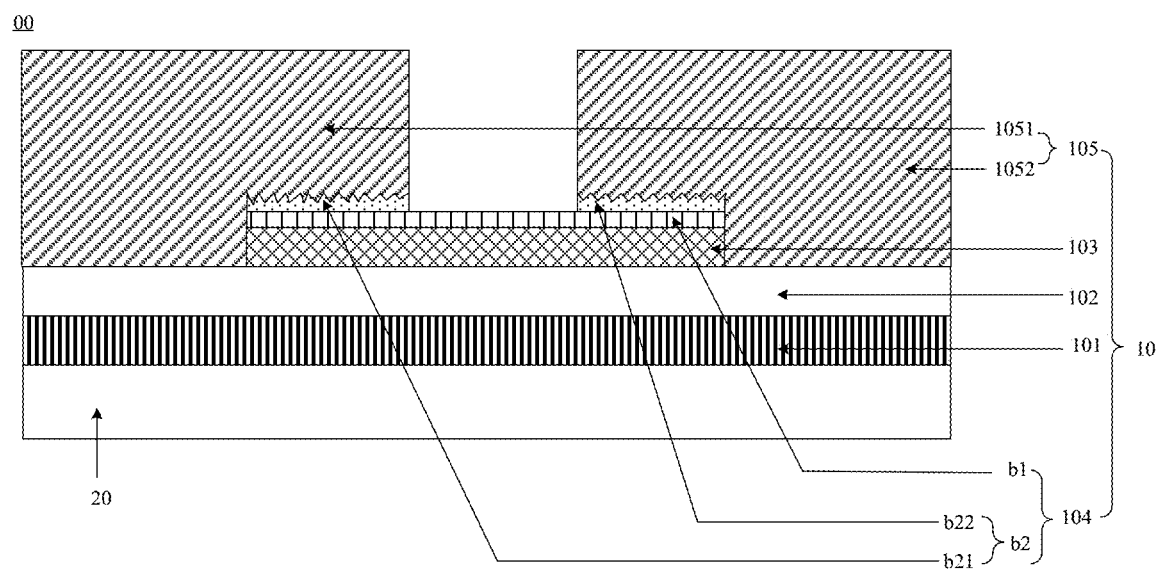
FIG. 3 is a schematic structural diagram of yet another display apparatus according to an embodiment of the present disclosure.

In another optional implementation, referring to FIG. 3, the protective layer 104 may include a first film layer b1 and a second film layer b2 that are laminated. The first film layer b1 and the second film layer b2 may be prepared through the same patterning process. Both the first film layer b1 and the second film layer b2 are c-axis crystalline IGZO film layers. In addition, the second film layer b2 may be acquired by performing plasma processing on the c-axis crystalline IGZO film layer. The temperature of the plasma processing ranges from 200° C. to 300° C.

Hence, both the first film layer b1 and the second film layer b2 are the c-axis crystalline IGZO film layers. That is, both the materials of the first film layer b1 and the second film layer b2 may be the c-axis crystalline IGZO. The ratio of indium atoms to gallium atoms to zinc atoms of the c-axis crystalline IGZO film layer is 4:2:3. Optionally, the channel layer 103 may be the nano-crystalline IGZO film layer described in any one of the foregoing embodiments.

Because the ratio among atoms of elements in the material of the channel layer 103 may be the same as the ratio among atoms of elements in the material of the protective layer 104, the target material does not need to be changed when the channel layer 103 and the protective layer 104 are prepared through magnetron sputtering. Certainly, if the ratio among the atoms of the elements in the material of the channel layer 103 is different from the ratio among atoms of elements in the material of the protective layer 104, the target material needs to be changed when the channel layer 103 and the protective layer 104 are prepared through magnetron sputtering.

Because the electrical conductivity of the nano-crystalline IGZO is generally good, the electrical conductivity of the channel layer 103 prepared from the nano-crystalline IGZO may be relatively good, and the source electrode 1051 or the drain electrode 1052 may be conducted via the channel layer 103.

Figure 4:
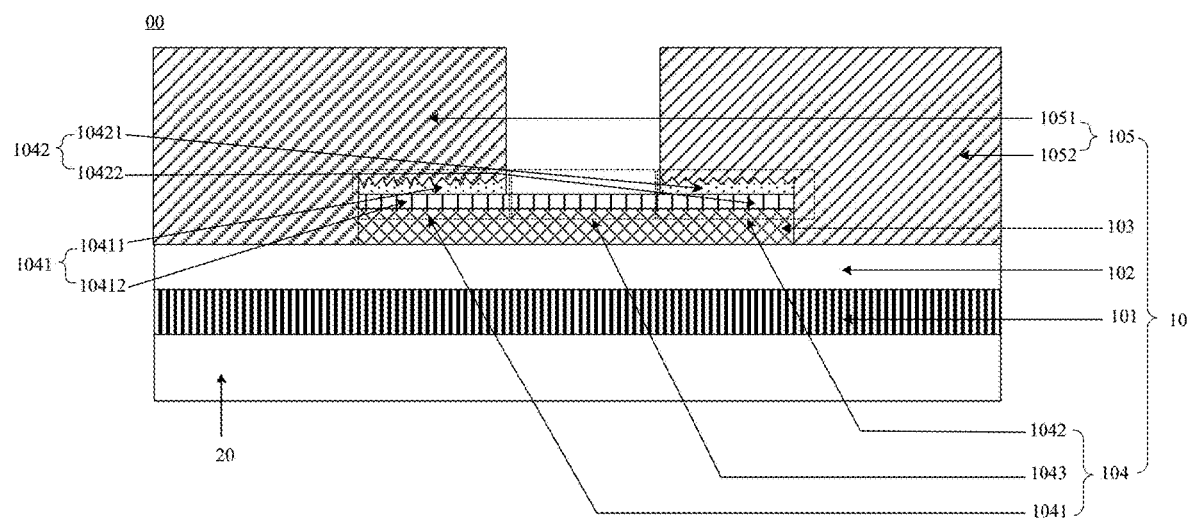
FIG. 4 is a schematic structural diagram of still yet another display apparatus according to an embodiment of the present disclosure.

In the embodiments of the present disclosure, the electrical conductivity of the c-axis crystalline IGZO is lower than the electrical conductivity of the nano-crystalline IGZO. With reference to FIGS. 3 and 4, to improve the electrical conductivity of the first target portion 10411 of the first portion 1041 proximal to source electrode 1051 and the electrical conductivity of the second target portion 10421 of the second portion 1042 proximal to the drain electrode 1052, of the protective layer 104, the plasma processing may be performed on the first target portion 10411 of the first portion 1041 proximal to source electrode 1051 and the second target portion 10421 of the second portion 1042 proximal to the drain electrode 1052 of the protective layer 104.

In the plasma processing process, under the strong energy bombardment of gases released during the plasma processing, In—O bonds on the first target portion 10411 of the first portion 1041 proximal to source electrode 1051 and the second target portion 10421 of the second portion 1042 proximal to the drain electrode 1052 break (because the bond energy of In—O bonds is lower than bond energies of Ga—O bonds and Zn—O bonds, the In—O bonds are easier to break than the Ga—O bonds and the Zn—O bonds). There are large quantities of indium ions on the first target portion 10411 of the first portion 1041 proximal to source electrode 1051 and the second target portion 10421 of the second portion 1042 proximal to the drain electrode 1052. Therefore, the first target portion 10411 of the first portion 1041 proximal to source electrode 1051 and the second target portion 10421 of the second portion 1042 proximal to the drain electrode 1052 may form an N-type semiconductor with a reduced resistance and an increased electrical conductivity. The N-type semiconductor may be an impurity semiconductor whose free electron concentration is far greater than hole concentration.

In the embodiments of the present disclosure, by performing the plasma processing on the first target portion 10411 of the first portion 1041 proximal to source electrode 1051 and the second target portion 10421 of the second portion 1042 proximal to the drain electrode 1052, electrical conductivities of the first target portion 10411 of the first portion 1041 proximal to source electrode 1051 and the second target portion 10421 of the second portion 1042 proximal to the drain electrode 1052 can be improved, which can prevent a large amount of heat from generating when the current flows into the protective layer 104 from the source electrode 1051 or the drain electrode 1052. Therefore, defects caused by the impact of a large amount of heat can be prevented from generating in the channel layer 103, and the electrical conductivity of the oxide thin film transistor 10 is ensured.

In order to prevent the electrical conductivity of the third portion 1043 from being high under the premise of improving the first target portion 10411 of the first portion 1041 proximal to source electrode 1051 and the second target portion 10421 of the second portion 1042 proximal to the drain electrode 1052 the plasma processing may not be performed on the third portion 1043.

In the embodiments of the present disclosure, in order to simplify the process for preparing the protective layer 104, the plasma processing may be performed on the side, distal from the channel layer 103, of the second protective pattern 104*a* of the protective layer 104. The electrical conductivity of the side, distal from the channel layer 103, of the second protective pattern 104*a* is relatively good after the plasma processing. Then, etching is performed on the surface of the area, overlapped with neither the source electrode 1051 nor the drain electrode 1052, of the second protective pattern 104*a* on which the plasma processing is performed, so that the electrical conductivity of the area recovers to the electrical conductivity before the plasma processing. In addition, after etching, the second protective pattern 104*a* is divided into two portions, one etched portion of two portions of the second protective pattern 104*a* may be the first sub-film layer b21 of the second film layer b2, and the second sub-film layer b22 of the second film layer b2, and the other un-etched portion of the second protective pattern 104*a* may be the first film layer b1.

Referring to FIGS. 3 and 4, after the plasma processing and etching, the surface of the first sub-film layer b21 distal from the first film layer b1 (namely, the surface of the first target portion 10411 of the first portion 1041 in contact with the source electrode 1051) and the surface of the second sub-film layer b22 distal from the first film layer b1 (namely, the surface of the second target portion 10421 of the second portion 1042 in contact with the drain electrode 1052) have poor flatness. That is, the surface of the first sub-film layer b21 distal from the first film layer b1 and the surface of the second sub-film layer b22 distal from the first film layer b1 are both of uneven structures. The first sub-film layer b21 and the second sub-film layer b22 are easy to discharge electricity when being in contact with the source electrode and drain electrode layer 105. Therefore, the contact resistance between the surface of the first sub-film layer b21 and the source electrode 1051 and the contact resistance between the surface of the second sub-film layer b22 and the drain electrode 1052 may be reduced.

After the plasma processing and etching, the portion of the second protective pattern 104*a* overlapped with the source electrode 1051 forms the first portion 1041 of the protective layer 104. The portion of the second protective pattern 104*a* overlapped with the drain electrode 1052 forms the second portion 1042 of the protective layer 104. The portion of the second protective pattern 104*a* overlapped with neither the source electrode 1051 nor the drain electrode 1052 forms the third portion 1043 of the protective layer 104.

Because the third portion 1043 is acquired by etching the second protective pattern 104*a*, and the first portion 1041 and the second portion 1042 are acquired from the second protective pattern 104*a* without etching, the thickness of the third portion 1043 may be less than the thickness of the first portion 1041, and may be less than the thickness of the second portion 1042.

Certainly, in order that that the protective layer 104 can protect the channel layer 103, an etching depth for the second protective pattern 104*a* may be less than the thickness of the second protective pattern 104*a*. That is, the second protective pattern 104*a* is not etched through. Optionally, the thickness of the third portion 1043 of the protective layer 104 may range from 10 nm to 20 nm.

In the embodiments of the present disclosure, the thickness of the channel layer 103 may range from 1 nm to 30 nm. The thickness of the protective layer 104 may range from 20 nm to 50 nm.

Referring to FIGS. 1 to 4, it can be learned that, in the display apparatus, the gate 101, the gate insulator 102, the channel layer 103, the protective layer 104 and the source electrode and drain electrode layer 105 may be sequentially laminated along a direction going away from the base substrate 20.

Figure 5:
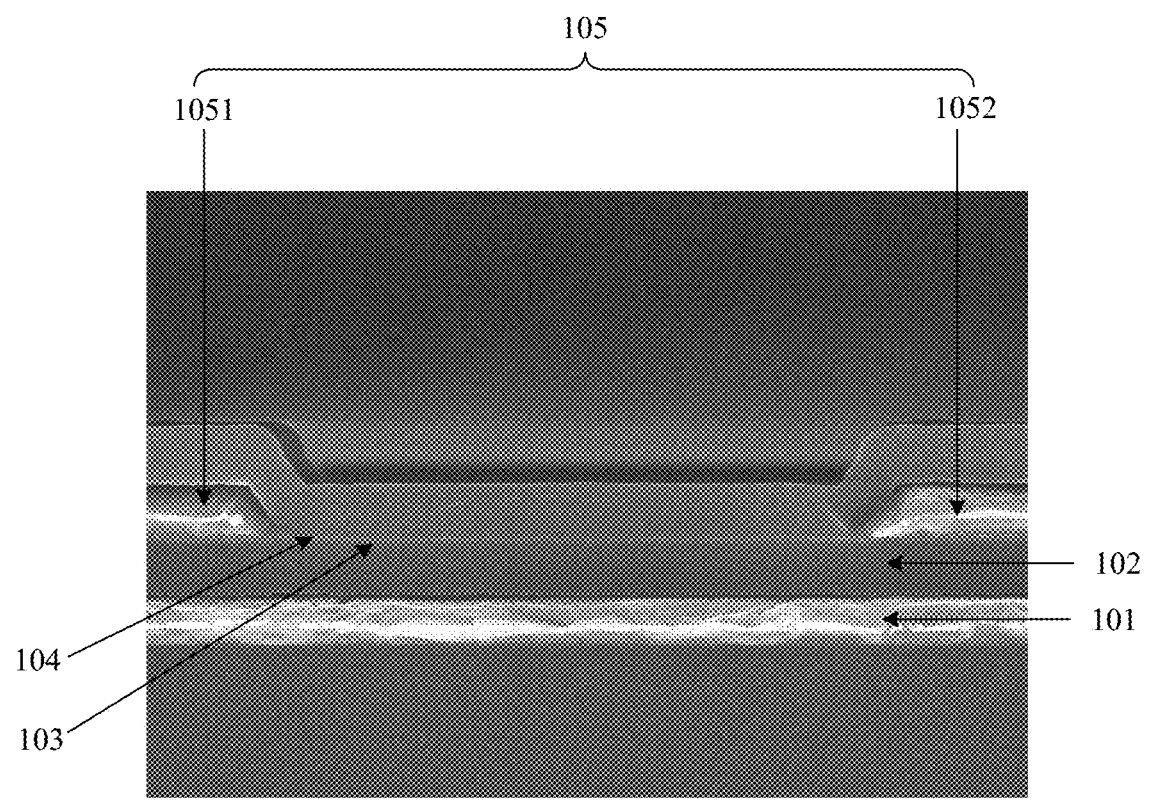
FIG. 5 is a schematic diagram of an oxide thin film transistor according to an embodiment of the present disclosure.
Figure 6:
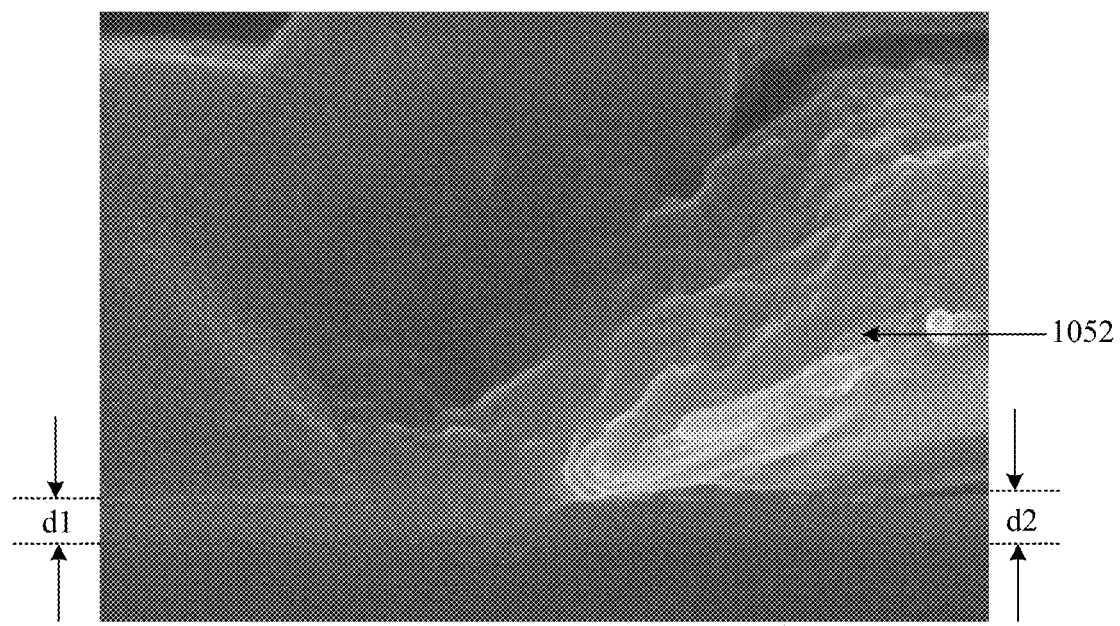
FIG. 6 is a schematic diagram of a partial structure of the oxide thin film transistor shown in FIG. 5.
Figure 7:
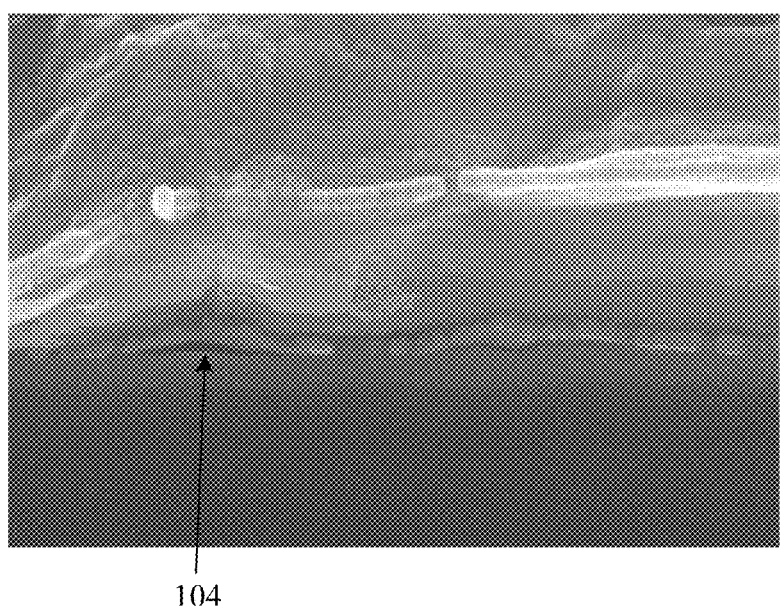
FIG. 7 is a schematic diagram of another partial structure of the oxide thin film transistor shown in FIG. 5.

FIG. 5 is a schematic diagram of an oxide thin film transistor according to an embodiment of the present disclosure. Referring to FIG. 5, it can be learned that, in the oxide thin film transistor 10, the thickness of the channel layer 103 and the thickness of the protective layer 104 may be far less than the thickness of other film layers. FIG. 6 is a schematic diagram of a partial structure of the oxide thin film transistor shown in FIG. 5. FIG. 7 is a schematic diagram of another partial structure of the oxide thin film transistor shown in FIG. 5. Referring to FIGS. 6 and 7, the total thickness d1 of the channel layer 103 and the third portion 1043 of the protective layer 104 may be 35.1 nm, and the total thickness d2 of the channel layer 103 and the second portion 1042 of the protective layer 104 may be 49.6 nm. The total thickness of the channel layer 103 and the first portion 1041 of the protective layer 104 may be equal to the total thickness of the channel layer 103 and the second portion 1042 of the protective layer 104.

An embodiment of the present disclosure provides a method for preparing an oxide thin film transistor 10. The method may be applicable to prepare the oxide thin film transistor 10 shown in FIG. 1. The method may include: forming a gate 101, a gate insulator 102, a channel layer 103, a protective layer 104, and a source electrode and drain electrode layer 105 on a base substrate 20. The source electrode and drain electrode layer 105 may include a source electrode 1051 and a drain electrode 1052 that are spaced.

The prepared protective layer 104 may be disposed between the channel layer 103 and the source electrode and drain electrode layer 105, and the protective layer 104 may be in contact with both the source electrode and drain electrode layer 105 and the channel layer 103. The orthographic projection of the protective layer 104 on the base substrate 20 may cover the orthographic projection of the channel layer 103 on the base substrate 20. The protective layer 104 may be configured to protect the channel layer 103, to prevent the side of the channel layer 103 distal from the base substrate 20 from being etched by an etchant, and ensure reliability of current transmission through the channel layer 103.

Referring to FIG. 1, the protective layer 104 may include a first portion 1041, a second portion 1042, and a third portion 1043 that are located in different areas of the protective layer 104. The first portion 1041 may have two surfaces, and the two surfaces of the first portion 1041 may be in contact with the channel layer 103 and the source electrode 1051 respectively. The second portion 1042 may have two surfaces, and the two surfaces of the second portion 1042 may be in contact with the channel layer 103 and the drain electrode 1052 respectively. The third portion 1043 may have two surfaces, one of the two surfaces of the third portion 1043 may be in contact with the channel layer 103, and the other surface may be in contact with neither the source electrode 1051 nor the drain electrode 1052.

Referring to FIG. 1, it can be further learned that, the third portion 1043 may be disposed between the first portion 1041 and the second portion 1042. The electrical conductivity of the first target portion 10411 of the first portion 1041 proximal to source electrode 1051 and the electrical conductivity of the second target portion 10421 of the second portion 1042 proximal to the drain electrode 1052 may be both greater than the electrical conductivity of the third portion 1043. That is, the electrical conductivity of the first target portion 10411 of the first portion 1041 proximal to source electrode 1051 and the electrical conductivity of the second target portion 10421 of the second portion 1042 proximal to the drain electrode 1052 may be relatively good, and the electrical conductivity of the third portion 1043 may be relatively low.

Because the electrical conductivity of the third portion 1043 is relatively low, the current of the source electrode 1051, after flowing from the first portion 1041, cannot be transmitted to the second portion 1042 through the third portion 1043, and the current of the drain electrode 1052, after flowing from the second portion 1042, cannot be transmitted to the first portion 1041 through the third portion 1043. Because the electrical conductivity of the channel layer 103 disposed on the side of the protective layer 104 proximal to the base substrate 20 is relatively good, the current of the source electrode 1051, after flowing from the first portion 1041, may be transmitted to the drain electrode 1052 through the channel layer 103 and the second portion 1042 of the protective layer 104 sequentially, and the current of the drain electrode 1052, after flowing form the second portion 1042, may be transmitted to the source electrode 1051 through the channel layer 103 and the first portion 1041 of the protective layer 104 sequentially.

In the embodiments of the present disclosure, because both the electrical conductivity of the first target portion 10411 of the first portion 1041 proximal to source electrode 1051 and the electrical conductivity of the second target portion 10421 of the second portion 1042 proximal to the drain electrode 1052 are relatively good, when the current flows into the protective layer 104 from the source electrode 1051 or the drain electrode 1052, a large amount of heat is not generated in the protective layer 104. Therefore, the reliability of the oxide thin film transistor 10 is improved.

In summary, the embodiment of the present disclosure provides a method for preparing an oxide thin film transistor. In the oxide thin film transistor prepared according to this method, the orthographic projection of the protective layer on the base substrate covers the orthographic projection of the channel layer on the base substrate. The protective layer can protect the channel layer, to prevent the side of the channel layer distal from the base substrate from being etched by an etchant, and ensure the reliability of current transmission through the channel layer. In addition, because the electrical conductivities of the first portion and the second portion of the protective layer are relatively good, when the current flows into the channel layer through the first portion or the second portion, a large amount of heat is not generated in the first portion or the second portion. Therefore, defects can be prevented from generating in the channel layer, and the electrical conductivity of the oxide thin film transistor is relatively good.

In the embodiments of the present disclosure, both the materials of the channel layer 103 and the protective layer 104 may be multi-element metallic oxides. The multi-element metallic oxide of the channel layer 103 may be a nano-crystalline oxide or amorphous oxide. The multi-element metallic oxide of the side of the protective layer 104 proximal to the channel layer 103 may be a c-axis crystalline oxide.

Alternatively, both the materials of the channel layer 103 and the protective layer 104 may be IGZOs. The IGZO of the channel layer 103 may be a nano-crystalline oxide or amorphous oxide. The IGZO of the side of the protective layer 104 proximal to the channel layer 103 may be a c-axis crystalline oxide.

Figure 8:
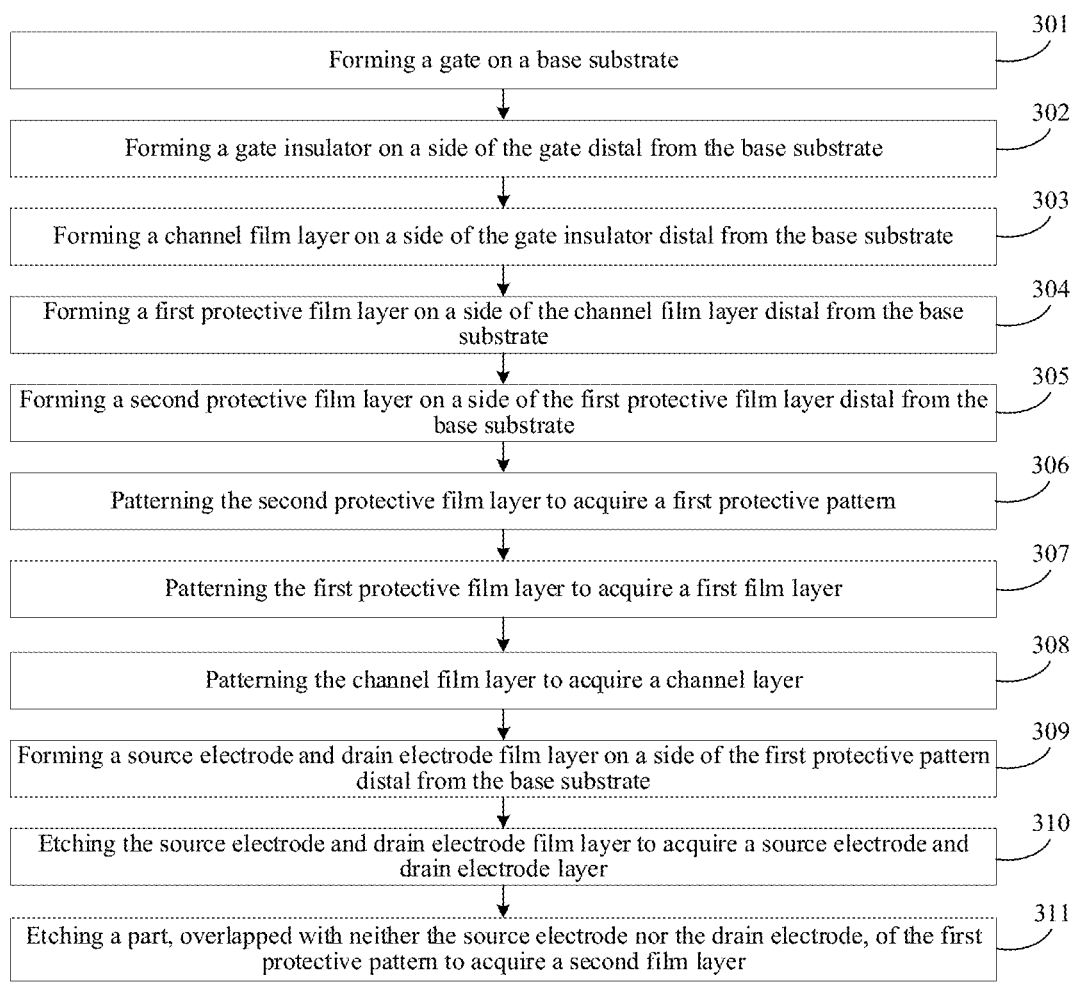
FIG. 8 is a flowchart showing a method for preparing an oxide thin film transistor according to an embodiment of the present disclosure.

FIG. 8 is a flowchart showing a method for preparing an oxide thin film transistor according to an embodiment of the present disclosure. The method may be applicable to prepare the oxide thin film transistor shown in FIG. 1. Referring to FIG. 8, the method may include the following steps.

In step 301, a gate is formed on a base substrate.

In the embodiments of the present disclosure, a base substrate 20 may be acquired first, and a gate film layer may be formed on a side of the base substrate 20; and then, the gate film layer may be patterned, to acquire a gate 101. The base substrate 20 may be a glass substrate.

In step 302, a gate insulator is formed on a side of the gate distal from the base substrate.

In the embodiments of the present disclosure, after the gate 101 is formed, a gate insulator 102 may be formed on the side of the gate 101 distal from the base substrate 20, such that the gate 101 is insulated from a source electrode 1051 and a drain electrode 1052 of the source electrode and drain electrode layer 105 that is formed subsequently.

In step 303, a channel film layer is formed on a side of the gate insulator distal from the base substrate.

Figure 9:
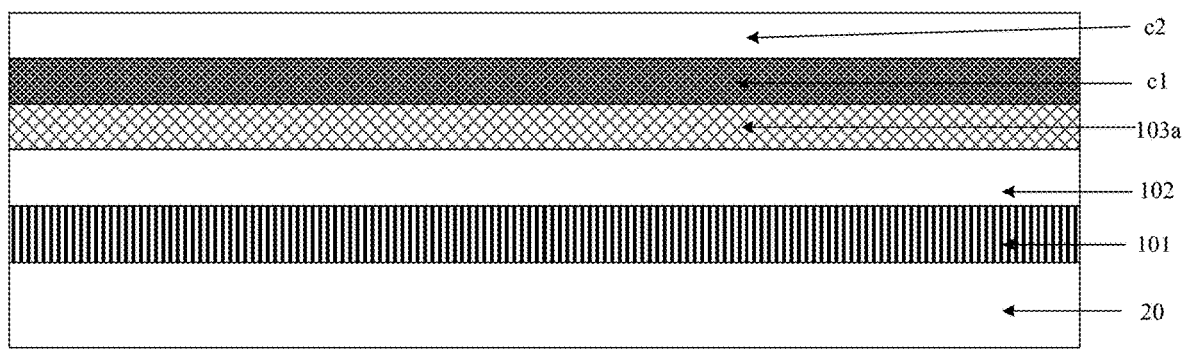
FIG. 9 is a schematic diagram of forming a channel film layer, a first protective film layer and a second protective film layer according to an embodiment of the present disclosure.

Referring to FIG. 9, after the gate insulator 102 is formed, the channel film layer 103a may be formed on the side of the gate insulator 102 distal from the base substrate 20. In addition, the channel film layer 103a may cover the entire base substrate 20. The channel film layer 103a may be made of a material with great electrical conductivity. For example, the material of the channel film layer 103a may be a nano-crystalline IGZO.

Optionally, the channel film layer 103a may be formed on the side of the gate insulator 102 distal from the base substrate 20 by using a magnetron sputtering device. When the channel film layer 103a is formed, the oxygen content of sputtering gases from the magnetron sputtering device may range from 1% to 30%, and the temperature of the base substrate 20 may range from 100° C. to 200° C. In addition, when the channel film layer 103a is formed, the power of the magnetron sputtering device may range from 10 KW to 40 KW.

In step 304, a first protective film layer is formed on a side of the channel film layer distal from the base substrate.

In the embodiments of the present disclosure, referring to FIG. 9, the first protective film layer c1 may be formed on the side of the channel film layer 103a distal from the base substrate 20. The first protective film layer c1 may be prepared from a material with low electrical conductivity, and the first protective film layer c1 may cover the entire base substrate 20. Optionally, the material of the first protective film layer c1 may be a c-axis crystalline IGZO.

Optionally, the first protective film layer c1 may be formed on the side of the channel film layer 103a distal from the base substrate 20 by using the magnetron sputtering device. When the first protective film layer c1 is formed, the oxygen content of the sputtering gases from the magnetron sputtering device ranges from 80% to 100%, and the temperature of the base substrate 20 may range from 100° C. to 300° C. In addition, when the first protective film layer c1 is formed, the power of the magnetron sputtering device may range from 10 KW to 40 KW.

In step 305, a second protective film layer is formed on a side of the first protective film layer distal from the base substrate.

In the embodiments of the present disclosure, referring to FIG. 9, a second protective film layer c2 may be formed on the side of the first protective film layer c1 distal from the base substrate 20. The second protective film layer c2 may be prepared from a material with good electrical conductivity, and the second protective film layer c2 may cover the entire base substrate 20. Optionally, the material of the second protective film layer c2 may be a nano-crystalline IGZO.

Because the material of the channel film layer 103a is the same as the material of the second protective film layer c2, the technology for preparing the second protective film layer c2 may be the same as that for preparing the channel film layer 103a. Optionally, the magnetron sputtering device may be used to form the second protective film layer c2 on the side of the first protective film layer c1 distal from the base substrate 20. When the second protective film layer c2 is formed, the oxygen content of the sputtering gases from the magnetron sputtering device ranges from 1% to 30%, and the temperature of the base substrate 20 may range from 100° C. to 200° C. In addition, when the second protective film layer c2 is formed, the power of the magnetron sputtering device may range from 10 KW to 40 KW.

In step 306, the second protective film layer is patterned to acquire a first protective pattern.

Figure 10:
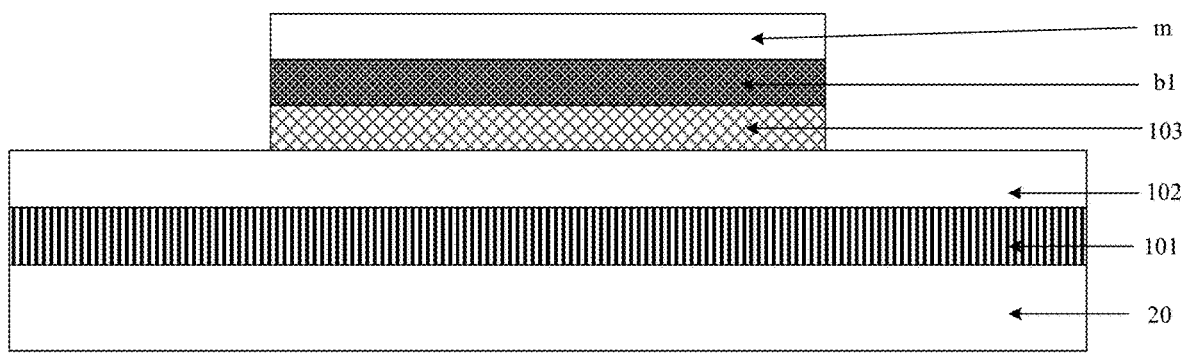
FIG. 10 is a schematic diagram of acquiring a first protective pattern, a first film layer and a channel layer according to an embodiment of the present disclosure.

In the embodiments of the present disclosure, referring to FIG. 10, the second protective film layer c2 may be patterned through a photoetching process, to acquire a first protective pattern m. The photoetching process may include: photo resist (PR) coating, exposure, developing, etching, PR stripping, and the like. The photoetching process may also be referred to as a mask process.

In step 307, the first protective film layer is patterned to acquire a first film layer.

In the embodiments of the present disclosure, referring to FIG. 10, after the second protective film layer c2 is patterned to acquire the first protective pattern m, the photoetching technology may still be used to pattern the first protective film layer c1, so as to acquire the first film layer b1. The orthographic projection of the first protective pattern m on the base substrate 20 covers the orthographic projection of the first film layer b1 on the base substrate 20. The first film layer b1 may include a third portion 1043, a third target portion 10412 of the first portion 1041 which is comprised of remaining of the first portion other than the first target portion 10411, and fourth target portion 10422 of the second portion 1042 which is comprised of remaining of the second portion other than the second target portion 10421. The third target portion 10412 is farther from the source electrode 1051 than the first target portion 10411, and the fourth target portion 10422 is farther from the drain electrode 1052 than the second target portion 10421.

Because the first film layer b1 is acquired by patterning the first protective film c1, the material of the first film layer b1 is also a c-axis crystalline IGZO, and the electrical conductivity of the first film layer b1 is relatively low. The first film layer b1 may also be referred to as a c-axis crystalline IGZO film layer.

In step 308, the channel film layer is patterned to acquire the channel layer.

In the embodiments of the present disclosure, referring to FIG. 10, after the second protective film layer c2 is patterned to acquire the first film layer b1, the photoetching process may still be adopted to pattern the channel film layer 103a, so as to acquire the channel layer 103. The orthographic projection of the first film layer b1 on the base substrate 20 covers the orthographic projection of the channel layer 103 on the base substrate 20.

Because the channel layer 103 is acquired by patterning the channel film layer 103a, the material of the channel layer 103 is also the nano-crystalline IGZO, and the electrical conductivity of the channel layer 103 is relatively good. The channel layer 103 may also be referred to as a nano-crystalline IGZO film layer.

In step 309, a source electrode and drain electrode film layer is formed on a side of the first protective pattern distal from the base substrate.

Figure 11:
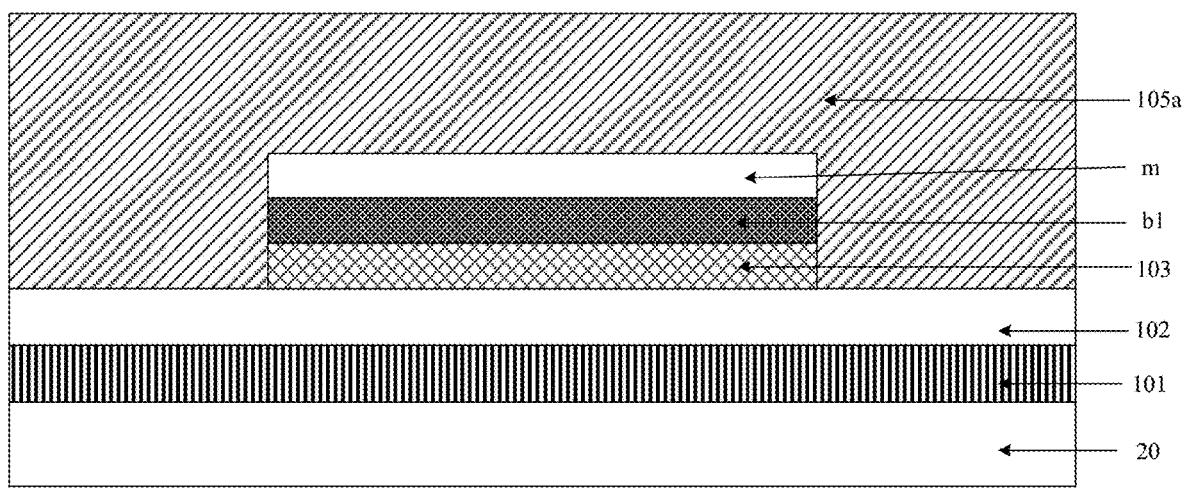
FIG. 11 is a schematic diagram of forming a source electrode and drain electrode film layer according to an embodiment of the present disclosure.

In the embodiments of the present disclosure, referring to FIG. 11, after the first protective pattern m is formed, the source electrode and drain electrode film layer 105a may be formed on the side of the first protective pattern m distal from the base substrate 20. The source electrode and drain electrode film layer 105a may cover the entire base substrate 20.

In step 310, the source electrode and drain electrode film layer is etched to acquire the source electrode and drain electrode layer.

Figure 12:
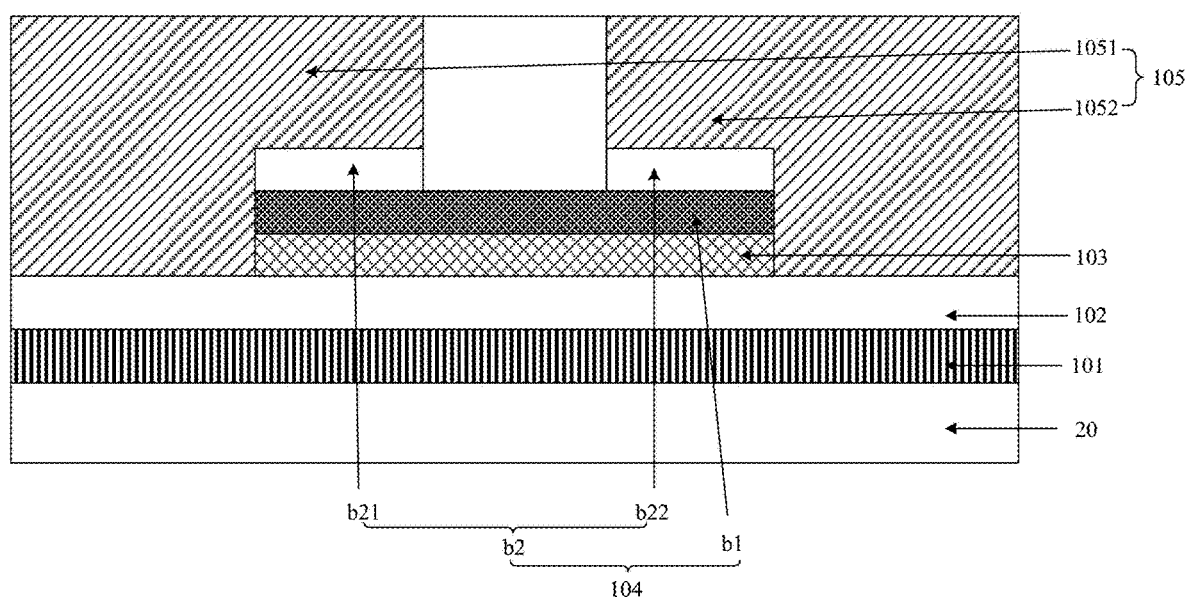
FIG. 12 is a schematic diagram of acquiring a source electrode and drain electrode layer and a second film layer according to an embodiment of the present disclosure.

In the embodiments of the present disclosure, referring to FIG. 12, wet etching may be performed on the source electrode and drain electrode film layer 105a by using an etchant, so as to acquire the source electrode and drain electrode layer 105. The source electrode and drain electrode layer 105 may include a source electrode 1051 and a drain electrode 1052 that are spaced. There is an overlapped area between the orthographic projection of the source electrode 1051 on the base substrate 20 and the orthographic projection of the channel layer 103 on the base substrate 20. There is an overlapped area between the orthographic projection of the drain electrode 1052 on the base substrate 20 and the orthographic projection of the channel layer 103 on the base substrate 20.

In the embodiments of the present disclosure, referring to FIG. 11, before etching the source electrode and drain electrode film layer 105a, the first film layer b1 and the first protective pattern m are formed between the channel layer 103 and the source electrode and drain electrode film layer 105a. The first film layer b1 and the first protective pattern m may be configured to protect the channel layer 103, to prevent the etchant from affecting the channel layer 103 when the source electrode and drain electrode film layer 105a is etched, thereby ensuring the yield of the channel layer 103. In addition, because the first film layer b1 and the first protective pattern m are disposed between the channel layer 103 and the source electrode and drain electrode film layer 105a, the channel layer 103 is not easily affected by material diffusion in the source electrode and drain electrode film layer 105a.

In step 311, a part, overlapped with neither the source electrode nor the drain electrode, of the first protective pattern is etched to acquire a second film layer.

Because the electrical conductivity of the first protective pattern m is relatively good, to prevent the current of the source electrode 1051 or the drain electrode 1052 from being transmitted through the first protective pattern m, referring to FIG. 12, after the source electrode and drain electrode film layer 105a is etched, the first protective pattern m on the side of the source electrode and drain electrode film layer 105a proximal to the base substrate 20 may be etched. That is, the area part, overlapped with neither the source electrode 1051 nor the drain electrode 1052, of the first protective pattern m is etched to acquire a second film layer b2. The second film layer b2 includes a first sub-film layer b21 in contact with the source electrode 1051 and a second sub-film layer b22 in contact with the drain electrode 1052. The first sub-film layer b21 may be the first target portion 10411 of the first portion 1041 proximal to source electrode 1051, and the first target portion 10411 is in contact with the source electrode 1051 and performs an electricity conduction function, of the first portion 1041 of the protective layer 104; and the second sub-film layer b22 may be the second target portion 10421 of the second portion 1042 proximal to the drain electrode 1052, and the second target portion 10421 is in contact with the drain electrode 1052 and performs an electricity conduction function, of the second portion 1042. The first film layer b1 and the second film layer b2 are differentiated by material, not merely by location. The electrical conductivity of the first film layer b1 is lower than that of the second film layer b2.

In the embodiments of the present disclosure, the second film layer b2 prepared in step 311 and the first film layer b1 prepared in step 307 may form the protective layer 104 of the oxide thin film transistor 10. The etching depth of the protective layer 104 may be greater than or equal to the thickness of the first protective pattern m. That is, the first protective pattern m may be etched through.

In addition, in order that the protective layer 104 can protect the channel layer 103, and to avoid the channel layer 103 from being affected when other film layers are formed subsequently on the side of the source electrode and drain electrode film layer 105a distal from the base substrate 20, the etching depth of the protective layer 104 may be less than the total thickness of the first protective pattern m and the first film layer b1. Optionally, the etching depth of the protective layer 104 may be controlled by controlling the etching duration. For example, in FIG. 12, the etching depth of the protective layer 104 may be equal to the thickness of the first protective pattern m.

Because the second film layer b2 is acquired by etching the first protective pattern m, and the first protective pattern m is acquired by patterning the second protective film layer c2, the materials of the second film layer b2 also include a nano-crystalline IGZO, and the electrical conductivity of the second film layer b2 is relatively good. In addition, the quantity of oxygen vacancies of the first sub-film layer b21 of the second film layer b2 and the quantity of oxygen vacancies of the second sub-film layer b22 of the second film layer b2 are both greater the quantity of oxygen vacancies of the first film layer b1. The second film layer b2 may also be referred to as a nano-crystalline IGZO film layer. In this case, the larger quantity the oxygen vacancies, the larger quantity the free electrons and the greater the electrical conductivity.

Because the second film layer b2 is proximal to the source electrode and drain electrode layer 105 relative to the first film layer b1, the current of the source electrode and drain electrode layer 105 may flow into the channel layer 103 through the second film layer b2 and the first film layer b1 sequentially. In addition, because the electrical conductivity of the second film layer b2 is relatively good, when the current flows into the second film layer b2, a large amount of heat is not generated in the second film layer b2, and the second film layer b2 can perform a heat buffering function. Therefore, defects caused by the impact of a large amount of heat can be prevented from generating in the channel layer 103, and the electrical conductivity of the oxide thin film transistor 10 is ensured.

It should be noted that, the order of the steps of the method for preparing the oxide thin film transistor 10 provided in the embodiments of the present disclosure may be appropriately adjusted, and steps may also be removed or added as required. For example, step 308 may be performed before step 304, and step 307 may be performed before step 305. That is, the order of steps 303 to 308 may be adjusted as follows: steps 303, 308, 304, 307, 305, and 306. In this case, each film layer is patterned as soon as it is formed. Alternatively, steps 306 to 308 may be performed synchronously. That is, the first protective pattern, the first film layer, and the channel layer may be prepared by the same patterning process. In this case, the orthographic projection of the first protective pattern on the base substrate, the orthographic projection of the first film layer on the base substrate, and the orthographic projection of the channel layer on the base substrate are overlapped. Any variations of methods readily derived by persons skilled in the art within the technical scope disclosed in the present disclosure shall fall within the protection scope of the present disclosure. Therefore, details are not described herein again.

In summary, the embodiment of the present disclosure provides a method for preparing an oxide thin film transistor. In the oxide thin film transistor prepared according to this method, the orthographic projection of the protective layer on the base substrate covers the orthographic projection of the channel layer on the base substrate. The protective layer can protect the channel layer, to prevent the side of the channel layer distal from the base substrate from being etched by an etchant, and ensure the reliability of current transmission through the channel layer. In addition, because the electrical conductivity of the second film layer of the protective layer is relatively good, after the current flows into the second film layer of the protective layer from the source electrode or the drain electrode, and then flows into the channel layer through the first film layer of the protective layer, the second film layer can perform a heat buffering function. Therefore, defects caused by the impact of a large amount of heat can be prevented from generating in the channel layer, and the electrical conductivity of the prepared oxide thin film transistor is ensured.

Figure 13:
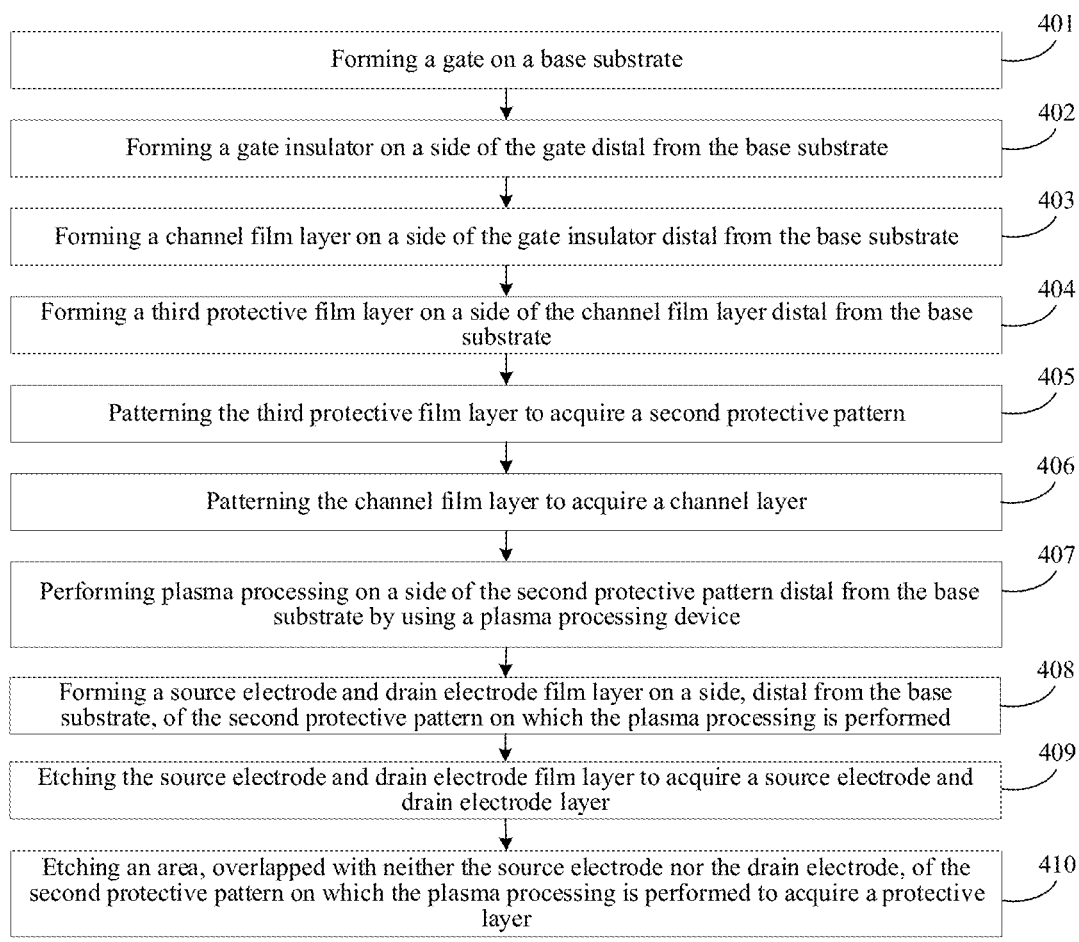
FIG. 13 is a flowchart showing another method for preparing an oxide thin film transistor according to an embodiment of the present disclosure.

FIG. 13 is a flowchart showing a method for preparing an oxide thin film transistor according to an embodiment of the present disclosure. The method may be applicable to prepare the oxide thin film transistor shown in FIG. 3. Referring to FIG. 13, the method may include the following steps.

In step 401, a gate is formed on a base substrate.

In the embodiments of the present disclosure, a base substrate 20 may be acquired first, and a gate film layer may be formed on a side of the base substrate 20, and then the gate film layer may be patterned, to acquire a gate 101. The base substrate 20 may be a glass substrate.

In step 402, a gate insulator is formed on a side of the gate distal from the base substrate.

In the embodiments of the present disclosure, after the gate 101 is formed, a gate insulator 102 may be formed on the side of the gate 101 distal from the base substrate 20, such that the gate 101 is insulated from the source electrode 1051 and the drain electrode 1052 of the source electrode and drain electrode layer 105 which is formed subsequently.

In step 403, a channel film layer is formed on a side of the gate insulator distal from the base substrate.

Figure 14:
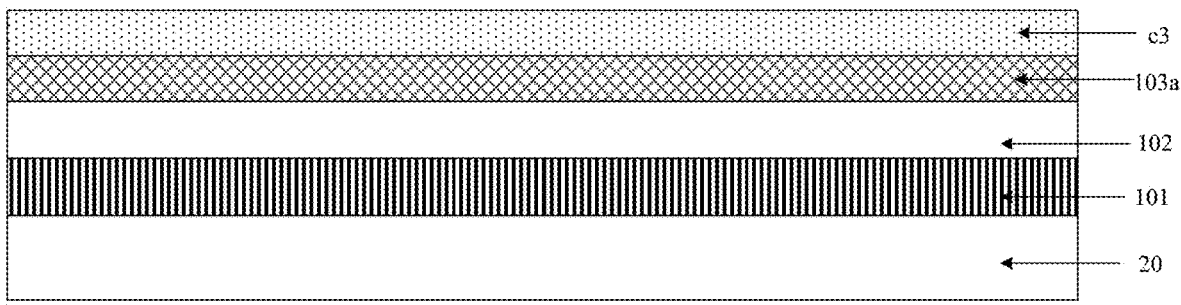
FIG. 14 is a schematic diagram of forming a channel film layer and a third protective film layer according to an embodiment of the present disclosure.

Referring to FIG. 14, after the gate insulator 102 is formed, the channel film layer 103a may be formed on the side of the gate insulator 102 distal from the base substrate 20. In addition, the channel film layer 103a may cover the entire base substrate 20. The channel film layer 103a may be made of a material with good electrical conductivity. For example, the material of the channel film layer 103a may be a nano-crystalline IGZO.

Optionally, the channel film layer 103a may be formed on the side of the gate insulator 102 distal from the base substrate 20 by using a magnetron sputtering device. When the channel film layer 103a is formed, the oxygen content of sputtering gases from the magnetron sputtering device may range from 1% to 30%, and the temperature of the base substrate 20 may range from 100° C. to 200° C. In addition, when the channel film layer 103a is formed, the power of the magnetron sputtering device may range from 10 KW to 40 KW.

In step 404, a third protective film layer is formed on a side of the channel film layer distal from the base substrate.

In the embodiments of the present disclosure, referring to FIG. 14, a third protective film layer c3 may be formed on the side of the channel film layer 103a distal from the base substrate 20. The third protective film layer c3 may be prepared from a material with low electrical conductivity, and the third protective film layer c3 may cover the entire base substrate 20. Optionally, the material of the third protective film layer c3 may be a c-axis crystalline IGZO.

Optionally, the third protective film layer c3 may be formed on the side of the channel film layer 103a distal from the base substrate 20 by using a magnetron sputtering device. When the third protective film layer c3 is formed, the oxygen content of the sputtering gases from the magnetron sputtering device ranges from 80% to 100%, and the temperature of the base substrate 20 may range from 100° C. to 300° C. In addition, when the third protective film layer c3 is formed, the power of the magnetron sputtering device may range from 10 KW to 40 KW.

In step 405, the third protective film layer is patterned to acquire a second protective pattern.

Figure 15:
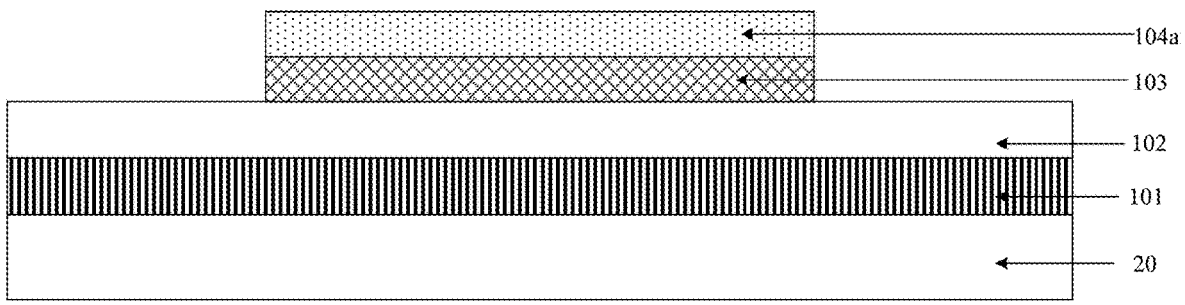
FIG. 15 is a schematic diagram of acquiring a channel layer and a second protective pattern according to an embodiment of the present disclosure.

In the embodiments of the present disclosure, referring to the FIG. 15, the third protective film layer c3 may be patterned through a photoetching process, so as to acquire the second protective pattern 104a. The photoetching process may include: PR coating, exposure, developing, etching, PR stripping, and the like. The photoetching process may also be referred to as a mask process.

In step 406, the channel film layer is patterned to acquire a channel layer.

In the embodiments of the present disclosure, referring to FIG. 15, after the third protective film layer c3 is patterned to acquire the second protective pattern 104a, the photoetching process may still be used to pattern the channel film layer 103a, so as to acquire the channel layer 103. The orthographic projection of the second protective pattern 104a on the base substrate 20 may cover the orthographic projection of the channel layer 103 on the base substrate 20.

Because the channel layer 103 is acquired by patterning the channel film layer 103a, the material of the channel layer 103 is also a nano-crystalline IGZO, and the electrical conductivity of the channel layer 103 is relatively good. The channel layer 103 may also be referred to as a nano-crystalline IGZO film layer.

In step 407, plasma processing is performed on a side of the second protective pattern distal from the base substrate by using a plasma processing device.

Figure 16:
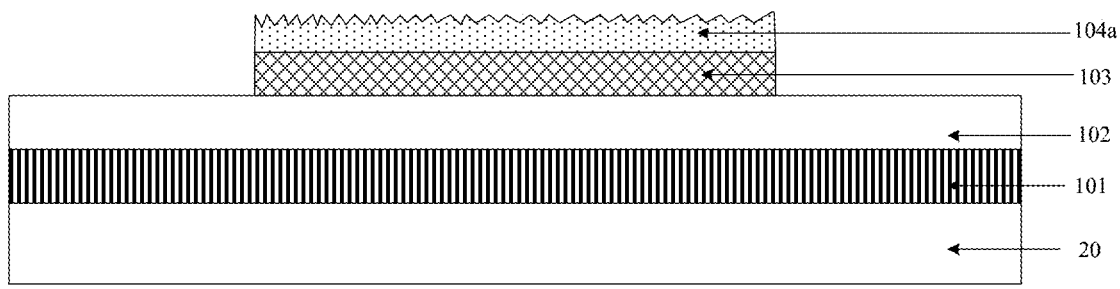
FIG. 16 is a schematic diagram of performing a plasma processing on a side of a second protective pattern distal from a base substrate.

In the embodiments of the present disclosure, referring to FIG. 16, the plasma processing may be performed on the side of the second protective pattern 104a distal from the channel layer 103 by using argon (Ar) released by the plasma processing device. The pressure of the plasma processing device may range from 0.3 Pa to 0.7 Pa, the power may range from 40 KW to 60 KW, the flow of Ar may range from 1000 sccm (standard milliliter per minute) to 2000 sccm, and the processing duration may range from 5 s to 15 s.

Under the strong energy bombardment of gases released during the plasma processing, In—O bonds on the side of the second protective pattern 104a distal from the channel layer 103 break, so that there is a large quantity of indium ions on the side of the second protective pattern 104a distal from the channel layer 103. The side of the second protective pattern 104a distal from the channel layer 103 may form an N-type semiconductor with a reduced resistance and an increased electrical conductivity. In addition, referring to FIG. 16, after the plasma processing, flatness of the side of the second protective pattern 104a distal from the channel layer 103 is poor (the side of the second protective pattern 104a distal from the channel layer 103 is of an uneven structure), and the side of the second protective pattern 104a distal from the channel layer 103 is easy to discharge electricity when being in contact with the source electrode and drain electrode layer 105 subsequently formed. Therefore, the contact resistance between the side of the second protective pattern 104a distal from the channel layer 103 and the source electrode and drain electrode layer 105 can be reduced.

In step 408, a source electrode and drain electrode film layer is formed on a side, distal from the base substrate, of the second protective pattern on which the plasma processing is performed.

Figure 17:
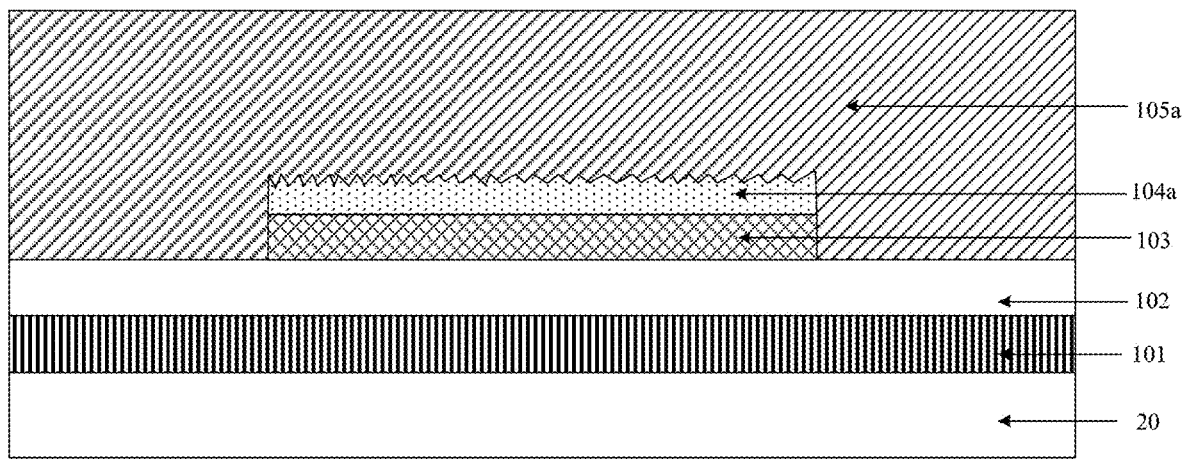
FIG. 17 is a schematic diagram of forming a source electrode and drain electrode film layer according to an embodiment of the present disclosure.

In the embodiments of the present disclosure, referring to FIG. 17, after the plasma processing is performed on the side of the second protective pattern 104a distal from the base substrate 20, the source electrode and drain electrode film layer 105a may be formed on the side of the second protective pattern 104a distal from the base substrate 20. The source electrode and drain electrode film layer 105a may cover the entire base substrate 20.

In step 409, the source electrode and drain electrode film layer is etched to acquire a source electrode and drain electrode layer.

Figure 18:
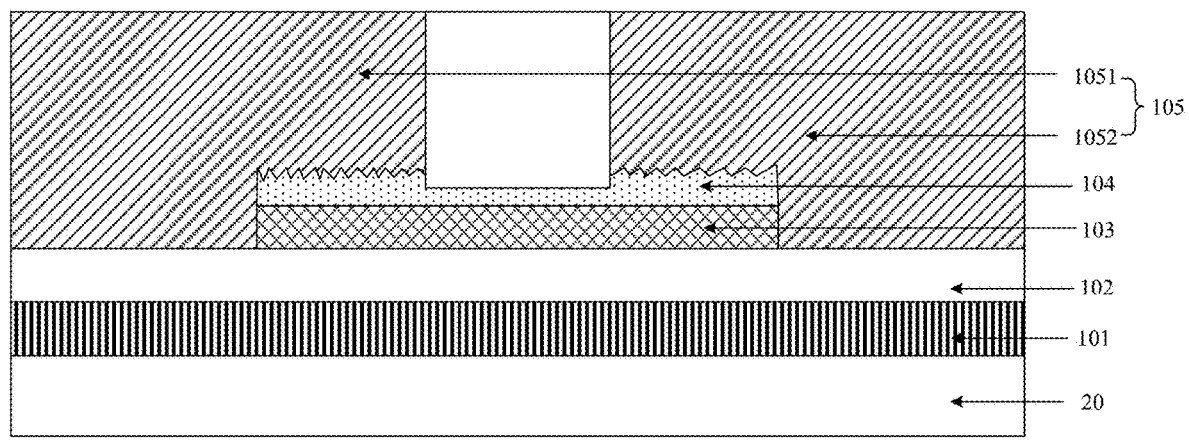
FIG. 18 is a schematic diagram of acquiring a source electrode and drain electrode layer and a protective layer according to an embodiment of the present disclosure.

In the embodiments of the present disclosure, referring to FIG. 18, wet etching may be performed on the source electrode and drain electrode film 105a by using an etchant, so as to acquire the source electrode and drain electrode layer 105. The source electrode and drain electrode layer 105 may include a source electrode 1051 and a drain electrode 1052 that are spaced. There is an overlapped area between the orthographic projection of the source electrode 1051 on the base substrate 20 and the orthographic projection of the channel layer 103 on the base substrate 20. There is an overlapped area between the orthographic projection of the drain electrode 1052 on the base substrate 20 and the orthographic projection of the channel layer 103 on the base substrate 20.

In step 410, an area, overlapped with neither the source electrode nor the drain electrode, of the second protective pattern on which the plasma processing is performed is etched to acquire a protective layer.

Because the plasma processing is performed on the side of the second protective pattern 104*a* distal from the base substrate 20, the electrical conductivity of each area on the side of the second protective pattern 104*a* distal from the base substrate 20 is relatively good. To prevent the current of the source electrode 1051 or the drain electrode 1052 from being transmitted through the second protective pattern 104*a*, referring to FIG. 18, after the source electrode and drain electrode film layer 105*a* is etched, the second protective pattern 104*a* on the side of the source electrode and drain electrode film layer 105*a* proximal to the base substrate 20 may be etched, so as to prepare the protective layer 104. That is, the area, overlapped with neither the source electrode 1051 nor the drain electrode 1052, of the second protective pattern 104*a* is etched. The electrical conductivity of the area, overlapped with neither the source electrode 1051 nor the drain electrode 1052, of the protective layer 104 may be relatively low, for example, may be equivalent to the electrical conductivity of the second protective pattern 104*a* without the plasma processing.

In the embodiments of the present disclosure, in order that the protective layer 104 can protect the channel layer 103, and to avoid the channel layer 103 from being affected when other film layers are formed subsequently, the etching depth of the second protective pattern 104*a* may be less than the thickness of the second protective pattern 104*a*. The etching depth of the second protective pattern 104*a* may be controlled by controlling the etching duration.

After etching, the second protective pattern 104*a* is divided into two portions, one etched portion of the two portions of the second protective pattern 104*a* may be a first sub-film layer b21 of a second film layer b2 of the protective layer 104, and a second sub-film layer b22 of the second film layer b2 of the protective layer 104, and the other un-etched portion of the second protective pattern 104*a* may be a first film layer b1 of the protective layer 104.

After the plasma processing and etching, the surface of the first sub-film layer b21 distal from the first film layer b1 and the surface of the second sub-film layer b22 distal from the first film layer b1 have poor flatness. That is, the surface of the first sub-film layer b21 distal from the first film layer b1 and the surface of the second sub-film layer b22 distal from the first film layer b1 are both of uneven structures. The first sub-film layer b21 and the second sub-film layer b22 are easy to discharge electricity when being in contact with the source electrode and drain electrode layer 105. Therefore, the contact resistance between the first sub-film layer b21 and the source electrode 1051 and the contact resistance between the second sub-film layer b22 and the drain electrode 1052 may be reduced.

After the plasma processing and etching, the part, overlapped with the source electrode 1051, of the second protective pattern 104*a* forms the first portion 1041 of the protective layer 104. The part, overlapped with the drain electrode 1052, of the second protective pattern 104*a* forms the second portion 1042 of the protective layer 104. The part, in contact with neither the source electrode 1051 nor the drain electrode 1052, of the second protective pattern 104*a* forms the third portion 1043 of the protective layer 104.

Because the third portion 1043, in contact with neither the source electrode 1051 nor the drain electrode 1052, of the protective layer 104 is acquired by etching the second protective pattern 104*a*, and the first portion 1041 and the second portion 1042 are obtained without etching the second protective pattern 104*a*, the thickness of the third portion 1043 may be less than the thickness of the first portion 1041, and may be less than the thickness of the second portion 1042.

Optionally, the thickness of the third portion 1043 of the protective layer 104 may range from 10 nm to 20 nm. The thickness of the first portion 1041 and the thickness of the second portion 1042 may range from 20 nm to 50 nm.

It should be noted that, the order of the steps of the method for preparing the oxide thin film transistor provided in the embodiments of the present disclosure may be appropriately adjusted, and steps may also be removed or added as required. For example, step 406 may be performed before step 404. That is, the order of steps 403 to 406 may be adjusted as follows: steps 403, 406, 404, and 405. In this case, each film is patterned as soon as it is formed. Alternatively, steps 405 and 406 may be performed synchronously. That is, the second protective pattern and the channel layer may be prepared through the same patterning process. In this case, the orthographic projection of the second protective pattern on the base substrate and the orthographic projection of the channel layer on the base substrate are overlapped. Any variations to the methods readily derived by persons skilled in the art within the technical scope disclosed in the present disclosure shall fall within the protection scope of the present disclosure. Therefore, details are not described herein again.

In summary, the embodiment of the present disclosure provides a method for preparing an oxide thin film transistor. In the oxide thin film transistor prepared according to this method, the orthographic projection of the protective layer on the base substrate covers the orthographic projection of the channel layer on the base substrate. The protective layer can protect the channel layer, to prevent the side of the channel layer distal from the base substrate from being etched by an etchant, and ensure the reliability of current transmission through the channel layer. In addition, because the electrical conductivity of the part of the protective layer in contact with the source electrode or the drain electrode (the part on which the plasma processing is performed but etching is not performed) is relatively good, when the current flows into the channel layer from the source electrode or the drain electrode through the protective layer, a large amount of heat is not generated in the protective layer. Therefore, defects can be prevented from generating in the channel layer, and the electrical conductivity of the oxide thin film transistor is good.

An embodiment of the present disclosure further provides a display apparatus. Referring to FIGS. 1 to 4, the display apparatus 00 may include: a base substrate 20, and the oxide thin film transistor provided in the foregoing embodiments and disposed on the base substrate 20. The oxide thin film transistor may be the oxide thin film transistor 10 shown in any one of FIGS. 1 to 4.

Optionally, the display apparatus may be any product or component with a display function and a fingerprint recognition function, such as a liquid crystal display apparatus, an organic light-emitting diode (OLED) display apparatus, electronic paper, a mobile phone, a tablet computer, a TV, a monitor, a notebook computer, a digital photo frame, or a navigator.

Described above are merely optional embodiments of the present disclosure, and are not intended to limit the present disclosure. Any modifications, equivalent substitutions, improvements and the like made under the spirit and principles of the present disclosure should be included within the scope of protection of the present disclosure.

What is claimed is:

1. An oxide thin film transistor, comprising:
a gate, a gate insulator, a channel layer, a protective layer, and a source electrode and drain electrode layer that are disposed on a base substrate, wherein
the source electrode and drain electrode layer comprises a source electrode and a drain electrode that are spaced; and
the protective layer is disposed between the channel layer and the source electrode and drain electrode layer, and is in contact with both the source electrode and drain electrode layer and the channel layer; an orthographic projection of the protective layer on the base substrate covers an orthographic projection of the channel layer on the base substrate; and the protective layer comprises a first portion, a second portion, and a third portion that are in different areas of the protective layer;
wherein the first portion has two surfaces, and the two surfaces of the first portion are in contact with the channel layer and the source electrode respectively; the second portion has two surfaces, and the two surfaces of the second portion are in contact with the channel layer and the drain electrode respectively; the third portion has two surfaces, one of the two surfaces of the third portion is in contact with the channel layer, and the other surface of the third portion is in contact with neither the source electrode nor the drain electrode;
wherein an electrical conductivity of a first target portion of the first portion proximal to the source electrode and an electrical conductivity of a second target portion of the second portion proximal to the drain electrode are both greater than an electrical conductivity of the third portion, a thickness of the first target portion is less than a thickness of the first portion, and a thickness of the second target portion is less than a thickness of the second portion;
the protective layer comprises a first film layer and a second film layer that are laminated sequentially along a direction going away from the base substrate, wherein the first film layer is in contact with the channel layer, and the first film layer and the second film layer are formed on the base substrate by using a magnetron sputtering device, wherein when the first film layer is formed, an oxygen content of sputtering gases from the magnetron sputtering device ranges from 80% to 100%, and a temperature of the base substrate ranges from 100° C. to 300° C., and when the second protective film layer is formed, the oxygen content of the sputtering gases from the magnetron sputtering device ranges from 1% to 30%, and the temperature of the base substrate ranges from 100° C. to 200° C.; wherein a material of the first protective film layer comprises a c-axis crystalline IGZO, and a material of the second protective film layer comprises a nano-crystalline IGZO.

2. The oxide thin film transistor according to claim 1, wherein a material of the channel layer is a multi-element metallic oxide, wherein
the multi-element metallic oxide of the channel layer is a nano-crystalline oxide or amorphous oxide.

3. The oxide thin film transistor according to claim 1, wherein a material of the channel layer is an indium gallium zinc oxide (IGZO), wherein
the IGZO of the channel layer is a nano-crystalline oxide or amorphous oxide.

4. The oxide thin film transistor according to claim 1, wherein
the second film layer comprises a first sub-film layer in contact with the source electrode and a second sub-film layer in contact with the drain electrode, wherein the first sub-film layer is the first target portion of the first portion proximal to the source electrode, and the second sub-film layer is the second target portion of the second portion proximal to the drain electrode; and
the first film layer comprises the third portion, a third target portion of the first portion which is comprised of remaining of the first portion other than the first target portion and a fourth target portion of the second portion which is comprised of remaining of the second portion other than the second target portion, wherein the third target portion is farther from the source electrode than the first target portion is, and the fourth target portion is farther from the drain electrode than the second target portion is; and
an electrical conductivity of the first film layer is lower than an electrical conductivity of the second film layer.

5. The oxide thin film transistor according to claim 4, wherein
the channel layer is a nano-crystalline IGZO film layer.

6. The oxide thin film transistor according to claim 5, wherein a ratio of indium atoms to gallium atoms to zinc atoms of the nano-crystalline IGZO film layer is 4:2:3.

7. The oxide thin film transistor according to claim 4, wherein
a thickness of the channel layer ranges from 1 nm to 30 nm;
a thickness of the first film layer ranges from 1 nm to 30 nm; and
a thickness of the second film layer ranges from 1 nm to 100 nm.

8. The oxide thin film transistor according to claim 2, wherein a grain size of the nano-crystalline oxide ranges from 2 nm to 4 nm.

9. The oxide thin film transistor according to claim 1, wherein
a thickness of the third portion is less than a thickness of the first portion; and
the thickness of the third portion is less than a thickness of the second portion.

10. An oxide thin film transistor, comprising:
a gate, a gate insulator, a channel layer, a protective layer, and a source electrode and drain electrode layer that are disposed on a base substrate, wherein
the source electrode and drain electrode layer comprises a source electrode and a drain electrode that are spaced, and
an orthographic projection of the protective layer on the base substrate covers an orthographic projection of the channel layer on the base substrate; and the protective layer comprises a first portion, a second portion, and a third portion,
wherein an orthographic projection of the first portion on the base substrate covers a first area, and the first area is an overlapped area of an orthographic projection of the source electrode on the base substrate and the orthographic projection of the channel layer on the base substrate; an orthographic projection of the second portion on the base substrate covers a second area, and the second area is an overlapped area of an orthographic projection of the drain electrode on the base substrate and the orthographic projection of the channel layer on the base substrate; an orthographic projection of the third portion on the base substrate covers a third area, and the third area is an overlapped area of an orthographic projection of a spacing area on the base substrate and the orthographic projection of the channel layer on the base substrate, the spacing area being an area between the source electrode and the drain electrode, wherein an electrical conductivity of a first target portion of the first portion proximal to the source electrode and an electrical conductivity of a second target portion of the second portion proximal to the drain electrode are both greater than an electrical conductivity of the third portion, a thickness of the first target portion is less than a thickness of the first portion, and a thickness of the second target portion is less than a thickness of the second portion;

the protective layer comprises a first film layer and a second film layer that are laminated sequentially along a direction going away from the base substrate, wherein the first film layer is in contact with the channel layer, and the first film layer and the second film layer are formed on the base substrate by using a magnetron sputtering device, wherein when the first film layer is formed, an oxygen content of sputtering gases from the magnetron sputtering device ranges from 80% to 100%, and a temperature of the base substrate ranges from 100° C. to 300° C., and when the second protective film layer is formed, the oxygen content of the sputtering gases from the magnetron sputtering device ranges from 1% to 30%, and the temperature of the base substrate ranges from 100° C. to 200° C.; wherein a material of the first protective film layer comprises a c-axis crystalline IGZO, and a material of the second protective film layer comprises a nano-crystalline IGZO.

11. The oxide thin film transistor according to claim 10, wherein an orthographic projection of the first film layer on the base substrate covers the orthographic projection of the channel layer on the base substrate;

the second film layer comprises a first sub-film layer and a second sub-film layer that are spaced, wherein an orthographic projection of the first sub-film layer on the base substrate covers the first area, and an orthographic projection of the second sub-film layer on the base substrate covers the second area; and an electrical conductivity of the channel layer and an electrical conductivity of the second film layer are both greater than an electrical conductivity of the first film layer.

12. The oxide thin film transistor according to claim 11, wherein a material of the channel layer is a multi-element metallic oxide; wherein the multi-element metallic oxide of the channel layer is a nano-crystalline oxide or an amorphous oxide; and a material of the channel layer is IGZO, wherein the IGZO of the channel layer is a nano-crystalline oxide or an amorphous oxide; and the channel layer is a nano-crystalline IGZO film layer.

13. A method for preparing an oxide thin film transistor, comprising:

forming a gate, a gate insulator, a channel layer, a protective layer, and a source electrode and drain electrode layer on a base substrate, wherein the source electrode and drain electrode layer comprises a source electrode and a drain electrode that are spaced;

the protective layer is disposed between the channel layer and the source electrode and drain electrode layer, and is in contact with both the source electrode and drain electrode layer and the channel layer; an orthographic projection of the protective layer on the base substrate covers an orthographic projection of the channel layer on the base substrate; and the protective layer comprises a first portion, a second portion, and a third portion that are in different areas of the protective layer, wherein the first portion has two surfaces, and the two surfaces of the first portion are in contact with the channel layer and the source electrode respectively; the second portion has two surfaces, and the two surfaces of the second portion are in contact with the channel layer and the drain electrode respectively; the third portion has two surfaces, one of the two surfaces of the third portion is in contact with the channel layer, and the other surface of the third portion is in contact with neither the source electrode nor the drain electrode, wherein an electrical conductivity of a first target portion of the first portion proximal to the source electrode and an electrical conductivity of a second target portion of the second portion proximal to the drain electrode are both greater than an electrical conductivity of the third portion, a thickness of the first target portion is less than a thickness of the first portion, and a thickness of the second target portion is less than a thickness of the second portion;

wherein a first protective film layer is formed on the base substrate by using a magnetron sputtering device, wherein when the first protective film layer is formed, an oxygen content of sputtering gases from the magnetron sputtering device ranges from 80% to 100%, and a temperature of the base substrate ranges from 100° C. to 300° C.; and a second protective film layer is formed on the base substrate by using the magnetron sputtering device, wherein when the second protective film layer is formed, the oxygen content of the sputtering gases from the magnetron sputtering device ranges from 1% to 30%, and the temperature of the base substrate ranges from 100° C. to 200° C.;

wherein a material of the first protective film layer comprises a c-axis crystalline IGZO, and a material of the second protective film layer comprises a nano-crystalline IGZO.

14. The method according to claim 13, wherein forming the protective layer on the base substrate comprises:

forming a third protective film layer on the base substrate;

patterning the third protective film layer to acquire a second protective pattern, wherein an orthographic projection of the second protective pattern on the base substrate covers the orthographic projection of the channel layer on the base substrate;

performing plasma processing on a side of the second protective pattern distal from the base substrate by using a plasma processing device; and etching a surface of an area, overlapped with neither the source electrode nor the drain electrode, of the second protective pattern on which the plasma processing is performed to acquire the protective layer, and an etching depth of the second protective pattern is less than a thickness of the second protective pattern.

15. A display apparatus, comprising a base substrate and a plurality of oxide thin film transistors according to claim 1 which are disposed on the base substrate.

\* \* \* \* \*